US011469592B1

(12) United States Patent
Doynov

(10) Patent No.: US 11,469,592 B1
(45) Date of Patent: Oct. 11, 2022

(54) METHOD AND SYSTEMS FOR ELECTROMAGNETIC PROTECTION WITH PERSISTENT SELF MONITORING AND CYBERSECURE LOCAL AND REMOTE STATUS REPORT

(71) Applicant: Plamen Doynov, Kansas City, MO (US)

(72) Inventor: Plamen Doynov, Kansas City, MO (US)

(*) Notice: Subject to any disclaimer, the term of this patent is extended or adjusted under 35 U.S.C. 154(b) by 0 days.

(21) Appl. No.: 17/706,041

(22) Filed: Mar. 28, 2022

Related U.S. Application Data

(63) Continuation of application No. 17/521,369, filed on Nov. 8, 2021.

(51) Int. Cl.
| | |
|---|---|
| *G01R 31/12* | (2020.01) |
| *H02H 9/04* | (2006.01) |
| *H02H 5/00* | (2006.01) |
| *G01R 31/327* | (2006.01) |
| *H02H 3/10* | (2006.01) |
| *H02H 3/08* | (2006.01) |
| *H02H 3/22* | (2006.01) |

(52) U.S. Cl.
CPC ............. *H02H 9/045* (2013.01); *G01R 31/12* (2013.01); *G01R 31/327* (2013.01); *H02H 5/00* (2013.01); *H02H 5/005* (2013.01); *H02H 9/04* (2013.01); *H02H 3/08* (2013.01); *H02H 3/105* (2013.01); *H02H 3/22* (2013.01); *H02H 9/041* (2013.01); *H02H 9/046* (2013.01)

(58) Field of Classification Search
CPC ...... G01R 9/08; G01R 31/00; G01R 29/0804; G01R 31/001; G01R 31/12; G01R 31/327; G01R 31/1254; G01R 29/0814; G05B 9/02
USPC ..................................................... 361/62–69
See application file for complete search history.

(56) References Cited

U.S. PATENT DOCUMENTS

| | | | |
|---|---|---|---|
| 9,562,938 B2 * | 2/2017 | Cox .................... G01R 31/001 |
| 10,985,559 B2 * | 4/2021 | Anderson .............. H02H 3/332 |

* cited by examiner

*Primary Examiner* — Danny Nguyen
(74) *Attorney, Agent, or Firm* — Dale J. Ream

(57) ABSTRACT

A system and method for persistent monitoring, detecting, and mitigating detecting and isolating a high-altitude electromagnetic pulse ("HEMP") along electrical lines electrically connected to a monitored infrastructure so as to protect the monitored infrastructure, the method including a phase unit receiving sensor signals from a plurality of analog sensor circuits electrically connected to each of the electrical lines, respectively, upstream of and associated with the monitored infrastructure. The method includes determining, limiting, shunting, and limiting the impinged transient surges and instantaneously indicates locally the status of the monitored parameters using visual and audio sound via a cybersecure optical communication channel supporting a plurality of wavelengths, from which one wavelength is utilized for a one-directional communication and a different wavelength optical signal establishing a controlled temporary two-directional communication for surge protection system maintenance and update.

30 Claims, 15 Drawing Sheets

Early time HEMP (E1)

$$E_1(t) = \begin{cases} 0 & \text{when } t \leq 0 \\ E_{01} \cdot k_1 \left(e^{-a_1 t} - e^{-b_1 t}\right) & \text{when } t > 0 \end{cases}$$

$E_{01} = 50{,}000$ V/m
$a_1 = 4 \times 10^7$ s$^{-1}$
$b_1 = 6 \times 10^8$ s$^{-1}$
$k_1 = 1.3$

Intermediate time HEMP (E2)

$$E_2(t) = \begin{cases} 0 & \text{when } t \leq 0 \\ E_{02} \cdot k_2 \left(e^{-a_2 t} - e^{-b_2 t}\right) & \text{when } t > 0 \end{cases}$$

$E_{02} = 100$ V/m
$a_2 = 1000$ s$^{-1}$
$b_2 = 6 \times 10^8$ s$^{-1}$
$k_2 = 1$

Late time HEMP (E3)

$$E_i(t) = \begin{cases} 0 & \text{when } t \leq 0 \\ E_{0i} \cdot k_i \left(e^{-a_i \tau} - e^{-b_i \tau}\right) & \text{when } t > 0 \end{cases}$$

$\tau = t - 1$
$E_{0i} = 0.04$ V/m
$a_i = 0.02$ s$^{-1}$
$b_i = 2$ s$^{-1}$
$k_i = 1.059$ $$E_j(t) = \begin{cases} 0 & \text{when } t \leq 0 \\ E_{0j} \cdot k_j \left(e^{-a_j \tau} - e^{-b_j \tau}\right) & \text{when } t > 0 \end{cases}$$

$\tau = t - 1$
$E_{0j} = 0.01328$ V/m
$a_j = 0.015$ s$^{-1}$
$b_j = 0.02$ s$^{-1}$
$k_j = 9.481$ $E_3(t) = E_i(t) - E_j(t)$

FIG. 6

| Standard Parameter | Bell Labs (1960s) DEXP | IEC-77C (1993) DEXP | Leuthauser (1994) QEXP | VG95371-10 (1995) DEXP | IEC 61000-2-9 (1996) DEXP |
|---|---|---|---|---|---|
| t10%-90% | 4.6 ns | 2.5 ns | 1.9 ns | 0.9 ns | 2.5 ns |
| Peak Field $E_o$ | 50 kV/m | 50 kV/m | 60 kV/m | 65 kV/m | 50 kV/m |
| FWHM | 18.4 ns | 23 ns | 23.8 ns | 24.1 ns | 23 ns |
| constant | 1.05 | 1.3 | 1.08 | 1.085 | 1.3 |
| $\alpha$ (1/sec) | $4 \times 10^6$ | $4 \times 10^7$ | $2.20 \times 10^9$ | $3.22 \times 10^7$ | $4 \times 10^7$ |
| $\beta$ (1/sec) | $4.76 \times 10^8$ | $6 \times 10^8$ | $3.24 \times 10^7$ | $2.07 \times 10^9$ | $6 \times 10^8$ |
| Energy Density | 0.891 J/m$^2$ | 0.114 J/m$^2$ | 0.167 J/m$^2$ | 0.196 J/m$^2$ | 0.114 J/m$^2$ |

FIG. 7

| IEC E1 HEMP Waveform Properties | |
|---|---|
| Characteristic | Value |
| Waveform peak | $E_{peak} = 50,000 \text{ V/m}$ |
| Spectrum peak | $E_{low\,freq} = 0.00152 \text{ V/m/Hz}$ |
| Waveform peak power | $P_{peak} = 6.64 \times 10^6 \text{ W/m}^2$ |
| Spectrum peak power | $P_{low\,freq} = 6.11 \times 10^{-9} \text{ W/m}^2/\text{Hz}$ |
| Total energy | $W_{total} = 0.115 \text{ J/m}^2$ |
| Time of peak | $t_{peak} = 4.84 \text{ ns}$ |
| Rise time, 10% to 90% of peak | $t_{10-90} = 2.47 \text{ ns}$ |
| Pulse width, full width at half maximum | $FWHM = 23.0 \text{ ns}$ |
| Pulse width, total energy over peak power | $W_{total}/P_{peak} = 17.3 \text{ ns}$ |
| Spectrum width, total energy over peak spectrum power | $W_{total}/P_{low\,freq} = 18.8 \text{ MHz}$ |

FIG. 8

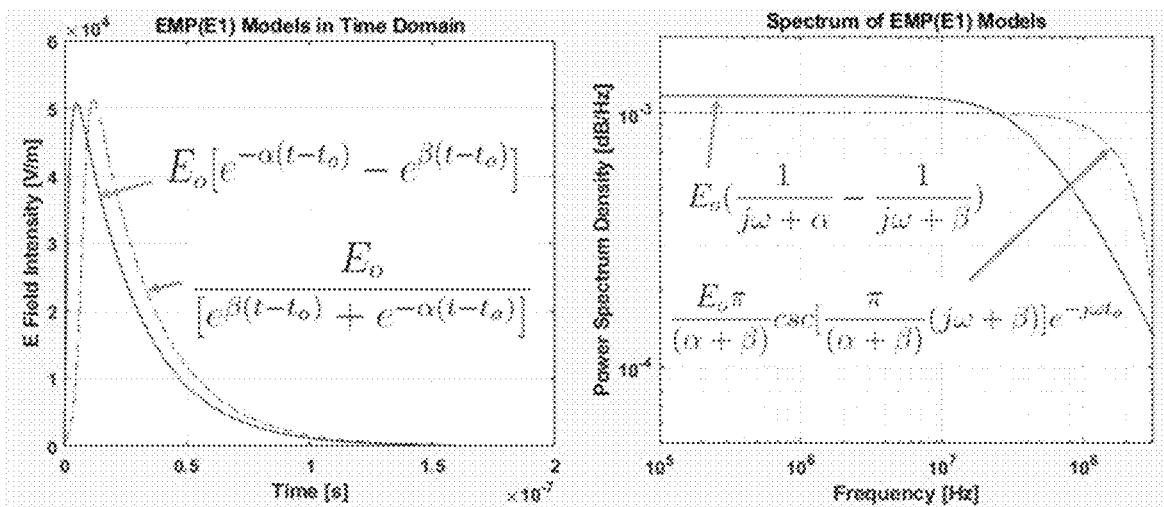

FIG. 9

| LED Indicator | Status | LED Color | Alarm Sound | Alarm LED |
|---|---|---|---|---|
| Phase 1 | OK | Green | OFF | Green |
| | TMOV-fuse off | Red | ON | Red |
| | Power OFF | Red | ON | Red |
| Phase 2 | OK | Green | OFF | Green |
| | TMOV-fuse off | Red | ON | Red |
| | Power OFF | Red | ON | Red |
| Phase 1 | OK | Green | OFF | Green |
| | TMOV-fuse off | Red | ON | Red |
| | Power OFF | Red | ON | Red |
| AC Power | 3 Phases Power Loss | OFF | Intermittent | Intermittent |
| High Temperature | Normal condition | Green | OFF | Green |
| | Temperature high | Red | ON | Red |
| Ground | Connected | Green | OFF | Green |
| | Not connected | Red | ON | Red |

FIG. 20

METHOD AND SYSTEMS FOR ELECTROMAGNETIC PROTECTION WITH PERSISTENT SELF MONITORING AND CYBERSECURE LOCAL AND REMOTE STATUS REPORT

REFERENCE TO RELATED APPLICATIONS

This application claims the priority of non-provisional patent Ser. No. 17/521,369 filed on Nov. 8, 2021, titled Method and Systems for Protection of Electrical Multiports from Electromagnetic Pulse Using Impedance Matching and Low Insertion Loss Design, which claims the priority art of non-provisional patent application Ser. No. 17/148,168 filed on Jan. 13, 2021, titled Method and Systems for Detection and Protection From Electromagnetic Pulse Events Using Hardware Implemented Artificial Intelligence (now U.S Pat. No. 11,714,483), which claims the priority art of non-provisional patent application Ser. No. 16/925,600, filed Jul 10, 2020 titled Method for Detecting an Isolating an Electromagnetic Pulse for Protection of a Monitored Infrastructure (now U.S Pat. No. 10,938,204), which claims the priority of non-provisional patent application Ser. No. 16/597,427 filed. Oct. 9, 2019, (now U.S Pat. No. 10,742,025), titled. System and Method for Detecting an Isolating an Electromagnetic Pulse for Protection of a Monitored Infrastructure, which claims the priority of non-provisional patent application Ser. No. 16/240,897 filed Jan. 7, 2019 (now U.S Pat. No. 10,530,151), titled System and Method For Suppressing Electromagnetic Pulse-Induced. Electrical System Surges, which claims the benefit of provisional patent application U.S. Ser. No. 62/615,159 filed Jan. 9, 2018 titled System and Method For Suppressing Electromagnetic Pulse-Induced Electrical System Surges, all of which are incorporated in their entirety herein by reference.

BACKGROUND OF THE INVENTION

This invention relates generally to persistent monitoring and detecting an electromagnetic pulse (EMP) and mitigating the impending effects of said pulse to prevent damage from the impinging surge energy to an infrastructure such as an electrical grid or its components for generating, transmitting, distributing, and using of electrical power at commercial facility, or the like as shown in FIG. 1.

An electromagnetic pulse, also sometimes called a transient electromagnetic disturbance, is a short burst of electromagnetic energy. The waveform of an EMP in time domain describes how the amplitude of the ultrashort pulse changes over the time and correlates to the intensity of the EM field. The real pulses tend to be quite complicated, so their simplified descriptions are typically characterized by:

The type of radiated (with different polarization) or conducted electromagnetic energy.

Pulse waveform: shape (rise and fall time), pulse width at half maximum (PWHM), duration, and peak amplitude.

The range or spectrum of frequencies present and the power spectrum distribution.

Any EMP is associated with electromagnetic interference (EMI) with respect to electrical systems, devices, and components. The degree of interference depends on the level of electromagnetic susceptibility of the system of interest and the immunity of its electrical and electronic components. The level of effect is related to the intensity and the duration of the EMP. Based on the generated frequency content and its distribution, an EMP is classified as "narrowband", "wideband" and "ultrawideband" electromagnetic source.

The frequency spectrum of the pulse and its waveform in time domain are interrelated analytically via the Fourier transform and other mathematical transformations for joint time-frequency representation (wavelet analysis, spectrograms, etc.). An EMP typically contains energy at many frequencies from direct current (DC) to some upper limit depending on the source. Withing the bandwidth, there could be multiple spectral peaks with high magnitudes. In general, the shorter the pulse (which also implies a short rise time) the broader the spread of energy over a range of frequencies. The commonly used first-order approximation is $f_h=0.35/\tau_r$, where $f_h$ (Hz) is the upper high frequency range and $\tau_r$ (seconds) is the rise time of the pulse from 10% to 90% of its peak amplitude.

An electromagnetic pulse, or EMP, can be generally characterized as a short duration burst of electromagnetic radiation generated by either natural events or man-made sources. Some examples for natural sources include the atmospheric lightning strikes, the Solar flares (intense eruptions of electromagnetic radiation in the Sun's atmosphere), which are often followed by Coronal Mass Ejection (CME), and solar particle events (proton acceleration), producing an immense amount of energy (usually estimated to $10^{20}$ Joules, with significant activity pushing that number up to $10^{25}$ Joules). Solar wind, Solar flares and CME are commonly known as Space weather events that produce Geomagnetic Disturbance (GMD) and associated currents with high magnitude and extremely low frequencies. Man produced EMP examples include an EMP associated with a nuclear blast and EMPs generated using Directed Energy Weapons (DEW), which are also known as Intentional Electromagnetic Interference (IEMI).

In this document, the focus is on the hazardous effects of EMP associated with the detonation of a nuclear weapon and the possible methods for protection from the generated electromagnetic fields. In the special case of nuclear detonation at high altitude above the Earth's surface, the EMP is known as nuclear (NEMP), high-altitude (HEMP), or High-altitude Nuclear EMP (HNEMP). Without loss of generality, FIG. 2 illustrates an electromagnetic pulse generation by high-altitude nuclear blast resulting in a HEMP. A source region EMP (SREMP) is a burst of energy similar to HEMP but created when a nuclear weapon detonates at lower altitudes within the atmosphere.

In general, the interactions of the high-energy gamma rays with the atoms in the atmosphere produce electrons (known as Compton electrons) which interact with the Geo-magnetic field resulting in a large region, which extends above the Earth's surface producing EM field with a Poynting vector from the source region towards the Earth's surface, as illustrated in FIG. 2 and FIG. 3. The field generated by a high-altitude EMP (HEMP) has a global impact and over the horizon extended effects. Its intensity changes along a North-South central line below the nuclear blast, indicated with GZ (Ground Zero) in FIG. 2. The pictograph of the nuclear burst and the Electromagnetic Field (EMF) Poynting vector direction with respect to the observer's location is shown in FIG. 3. The intensity of the pulse varies by location (latitude) due to the Geo-magnetic field distribution. Some additional relevant factors will be discussed further while the specific details of the related physical phenomena are beyond the scope of this application. Please note that the figures from FIG. 2 to FIG. 10 are included to illustrate and supplement the description of the physical phenomena associated with HEMPs, their modeling, simulation, and understanding.

The terms "EMP" or "HEMP" as used herein refer to the electromagnetic pulse generated by a nuclear blast at high altitude, a directed energy weapon (DEW) source for high-power electromagnetic energy, other devices for intentional EMI (IEMI), natural Space weather events within the Solar system, supernova explosion, and other cosmic phenomenon resulting in.

Geomagnetic Disturbance (GMD) and large scale EMP effects. While the natural events associated with the Solar activity are monitored and occur with an 11-year periodic cycle, the HEMP is typically classified as "low-probability, high-impact event" initiated by a nuclear explosion at high altitude. The DEW and IEMI have targeted and localized effects posing a threat that have to be considered and countermeasures need to be deployed at critical infrastructure systems.

An EMP event can induce voltages and corresponding currents into different electrical systems. The magnitude of the induced voltage/current depends on the coupling of the EM field with the system (its susceptibility) and the characteristics of the EM wave (direction, polarization, frequency content, and others). The transmission lines of the electric power distribution grid, as well as the electrical systems of localized mini-grids, renewable energy systems, communication lines, commercial buildings, electrical wiring of buildings, and even vehicle electrical systems (on land, air, and sea) are readily exposed to the EMP. FIG. 4 illustrates the coupling of the EM energy into a transmission line located at height h above the ground. The image displays a few key relations of the electric field (E) and magnetic field (B) using the Half-space Earth model. The image is from "The Early-time (E1) HEMP and its impact on the US Power Grid" report, written in 2010 by Savage et al, Metatech Corporation, and provides an excellent analysis of the physical phenomena associated with the HEMP.

Unless monitored, detected, isolated, or suppressed and redirected, the unwanted induced current and over-voltage surges from an EMP can damage or destroy components within the electrical systems in the area of impact, which is global in the case of HEMP. The result is diminishing the operability of the electrical grid, subsystems and rendering them unusable until repaired or replaced. As seen in FIG. 2, due to its origin, a HEMP will induce effects in a very large area. Similarly, it is understood that a massive solar ejection (CME) reaching the Earth imposes GMD which have damaging effects and failure of components within the electrical grid and the electrical infrastructure components with induced over-currents, resulting, for example, in overheating and damaging of high-voltage transformers.

Unlike the electromagnetic radiation or pulse associated with common natural phenomena (lighting strikes, transmission lines overvoltage from load switching, harmonics, etc.), the HEMP comprises of more complex time and frequency domain characteristics. Historically, the HEMP is described with several stages in time following the nuclear blast. They are also known as HEMP phases or pulses of varying waveform (magnitude, duration, frequency content, etc.). Therefore, the HEMP is more accurately described as a complex, electromagnetic multi-pulse event—a sequence of three primary components defined by the International Electrotechnical Commission (IEC) as E1, E2, and E3 sequential phases of the high-altitude EMP (HEMP). The characteristics of these phases (pulses) of HEMP are further described in this application. The relative electric field strength of the time sequence is displayed in FIG. 5a and FIG. 5b using logarithmic scales for E (V/m) vs Time (s). Some of the commonly used analytical expressions for the HEMP E1, E2, and E3 waveforms are given in FIG. 6, which presents the waveforms, and the model parameter values.

Starting in the 1960s, multiple waveform descriptions have been developed in order to model the associated hazardous effects. A series of standards related to the description of the associated waveforms are known as EEC 77C Standards. The evolution of the unclassified standards with respect to the El HEMP environment can be seen in the Table in FIG. 7, which displays the changes of the waveform parameters of the unclassified HEMP El environment Standards. Some additional details of the associated pulse waveform characteristics are given in the Table in FIG. 8.

As can be seen from the Table in FIG. 7, the most common analytical expressions for El HEMP are the Difference of Double Exponential (DEXP) and the Quotient of Exponentials (QEXP). The plots of DEXP and QEXP in time domain and their respective spectral distribution in frequency domain are presented in FIG. 9. The DEXP and the QEXP are most frequently used analytical expressions for modeling. Additional analytical expressions have also been developed. Their description is beyond the scope of this application.

The damage to electrical and electronic devices is determined by the amount of energy that is transferred to the devices in the given electromagnetic environment. Potentially, all electrical or electronic equipment has a level of susceptibility: from no effect to upset, malfunction and permanent damage under the electromagnetic radiation of sufficient intensity. The plots in FIG. 10 illustrate the power spectrum density (V/m-Hz) associated with a HEMP E1, an atmospheric lightning, and IEMI (high-power electromagnetic radiation, high-intensity RF).

The level of system vulnerability is dependent on the intensity of the EMF and the coupling of the external fields to the electrical circuits and the immunity characteristics of circuits components. A temporary malfunction (or upset) can occur when an electromagnetic field induces current(s) and voltage(s) in the operating system electronic circuits at levels that are comparable to the normal operational rating characteristics. Regardless of the EMP source and its characteristics (power, frequency, mode), two principal coupling modes are possible, and the relevant standards relate to assessing how much radiated power is coupled into a target system: (1) "Front door" coupling (FDC), and (2) "Back door" coupling (BDC). The FDC is typically observed when the power radiated from an IEMI source is directly coupled into the electronic systems with an antenna. The antenna/transmitter subsystem is designed to receive and transmit RF signals, and thus provides an efficient path for the energy flow from the electromagnetic environment to enter the equipment and cause damage especially when the antenna's bandwidth is withing the frequency range of the IEMI source (in band coupling). As seen in FIG. 10, the HEMP E1 has a very broad bandwidth.

The BDC occurs when the electromagnetic field of the environment propagates and couples through the existing gaps, small apertures, electrical wiring and interconnecting cables, connections to the power mains, communication cables, network and telephone copper wires, unshielded sections, and others. The BDC can generally be described as a wide-range interference at specific narrow-band susceptibility characteristics because of existing apertures and modes of coupling to cables.

Since the impinging EMP field has a broad frequency spectrum and a high field strength, the antenna coupling must be considered with the in band and out of band interference. Any electrically penetrating conducting structures, power lines, and communication cables are inadvertent, unintended, or parasitic antennae that collect EMP energy and allow its entry into a building, a device, or an enclosure. The electrical wires of the grid can be considered as an unintended pathway and as an imperfect antenna connected to the upstream and downstream components of the electrical network. The power transmission lines are susceptible to broadband frequencies, including the lower frequency (long wavelength) coupling due to their long length. Additional factors influence the level of coupling and interference: wave direction and polarization, geolocation, ground surface conductivity, height of the wires above ground, shielding, and others. With their long length, the electrical transmission lines are some of the structures especially susceptible to the E3 HEMP, as further described below. The internal wiring of building, including data and communication centers, are also susceptible to EMF and would couple directly to the radiated field if the building is without a proper shielding. The indirect coupling to communication lines due to proximity of power distribution cables is also present.

Protection of electrical and electronic systems from radiated coupling of EM field is achieved by shielding of equipment with a conductive enclosure. In some cases, the whole building can be a shielding structure, commonly known as a Faraday cage shielding. Because input and output cables for power and communications must be present, special methods are employed to lower and limit the propagation of the induced transients via these wired connections and their conduit openings.

As described in the referenced related prior patents, one possible way to mitigate the effects of EMP is to detect in real time the occurrence of an event and trigger means to absorb and redirect the excessive energy surge, or disconnect the protected systems by isolating them physically from long cables, wires, antennas, etc. An additional protection method is to equip the electrical and electronic systems with means that prevent the excessive magnitude of voltage and current and limit, shunt, absorb, and redirect the energy of the EMP. Generally, these devices are known as surge suppressors and arrestors. Most commercially available surge suppressing devices are design and built to offer protection to lightning with micro-seconds response times. This is not sufficient for protection from the HEMP E1 and IEMI waveforms with nano-second and even sub nano-second rise times. The referenced related applications provide novel solutions for mitigation of the E1, E2, and E3 components of an EMP. Specifically, to protect from the damaging effects of EMP, the protection measures must be persistently engaged without interfering with the normal operation of the protected system. That implies implementing protection with threshold settings outside the normal operating range and, yet, limiting within close values above the working range.

An illustration is presented in FIG. 11 for a metal oxide varistor (MOV) and a gas discharge tube (GDT) surge suppressing devices. In this simple example, the normal operating range of the protected device is below the limiting level labeled as the "DC breakdown voltage". The three superimposed plots illustrate the transient waveform without a surge suppression, the limiting threshold level response of the MOV, and the typical crowbar shunting response of the GDT. When GDT devices are used for surge protection, they are usually referred as surge arrestors. In designing practical surge protecting circuits, nonlinear devices such as MOVs, GDTs, and semiconductor devices (thyristor, avalanche-type Zener diode, etc.) are combined with additional components: inductors and capacitors filters, thermal and current fuses, and others. In Sep. 2006, the Underwriter Laboratories published the revised version of "UL Standard for Safety for Surge Protective Devices, UL 1449", and replaced the commonly used transient voltage surge suppressor (TVSS) by surge protective devices (SPDs). In this application, the SPD acronym is used for surge protection device and may include different implementation technologies: MOVs, TVSs, GDTs, glass gas discharge tube (GGDT), and other emerging surge limiting and shunting components.

There are multiple type of surge suppressing devices based on different technologies and materials. The devices can and are implemented in different combinations and configurations. Some implementations are described in the referenced related applications including novel solutions providing enhanced EMP protection. The main goal is fast and effective response to an EMP event with a system-wide protection. In general, this includes common mode and differential mode protection. For example, for an AC distribution circuit, this implies line protection for each phase to phase, phase to neutral, and phase to ground line pairs. Typically, the breakdown voltage of the protective components is selected 20% or more above the normal operating voltage and depends on the specific implementation and the environment surges. The appropriate response must be triggered to provide adequate protection for the monitored infrastructure. There are multiple considerations for the design and implementation of surge protection. Due to the complexity of the HEMP with the different characteristics of the E1, E2, and E3, a hybrid combinations of multiple surge suppression components are utilized to provide a fast response to HEMP E1 and an extended energy mitigation capacity to HEMP E2 and E3.

In developing surge protection circuits, the designer must look after two important aspects, namely: (1) the inserted surge protection stages should not alter the normal operation of the protected system; (2) components used for surge absorption, diversion, or attenuation should withstand the surges safely. Reliability of the surge protection system is a very important concern, since in practical circumstances, if a very high-magnitude voltage surge enters the system, it might damage the surge arrestor in a non-safe manner. The potential fire hazard was addressed with the development of MOVs devices with an embedded thermal fuse and an additional terminal to be used for "open fuse" indication. Because of the variety of circuit designs with non-linear components for surge protection, additional measures are necessary to provide a proper SPD operation and a failsafe assurance.

In general, the available surge protection devices (SPD) incorporate some form of system status indicators. Usually, this includes light emitting diodes (LEDs) and/or an audible indicator. The implemented state indication is limited to a local annunciation and is intended for use by a present human observer. This presents certain limitations given the usual place of installation of the SPDs. Respectively, a direct line of sight is necessary for the front panel LED indicators. In addition, an audible status indication is not sufficient when multiple devices are installed in closed proximity. While a cluster installation is not common for small commercial and residential installations, it presents a deficiency for proper status monitoring of the protective devices in more complex infrastructure deployments. Nevertheless, it is preferable and, in some application, necessary to be able to monitor the status of the installed SPDs remotely with a convenient display and automatically without any additional efforts.

The present invention recognizes the described deficiencies and provides solutions for implementing protection of electrical and electronic infrastructure from EMP using method and systems for persistent self-monitoring with local and remote status report. The design of the protection device includes LED indication for each protected line, thermal overload, ground disconnect, and an overall alarm. In addition, every abnormal condition is indicated with an audible alarm. Because a surge may result in power lost due to the fuse line disconnect, the present invention uses an embedded power supply based on combined AC/DC converters providing DC supply for the annunciator circuits even in the case of a phase line power loss. Furthermore, the current application includes a DC power storage subcircuit based on a supercapacitor. In the situation of complete AC power loss on all input AC power lines, the supercapacitor provides local and/or remote notification for the "alarm" status.

The current application provide solution for a secure status communication to a remote central display location with capabilities to monitor the status of hundreds and even thousand of SPDs. Given the complexity and scale of modern critical infrastructure, the proposed solution provides installation flexibility for multiple distributed and clustered SPDs. Given the constantly present cybersecurity threats, the current application offers a solution using one-directional communication channel for remote status display.

Some aspects on remote EMP detection notification using fiberoptic is addressed in referenced patent application Ser. No. 16/925,600 filed Jul. 10, 2020 (now US Pat. No. 10,938,204), titled "Method for Detecting an Isolating an Electromagnetic Pulse for Protection of a Monitored Infrastructure". It is used to communicate the detection of a HEMP E1 and to trigger an additional protective action, The present application provides solution for more complete SPD status indication in real time with local display and status report to remote location. The remote link is with one-way communication for an ultimate cybersecure implementation. Additional features of the novel method and systems will be described further.

The present invention includes a solution for transient search protection of a monitored system which is enhanced with persistent self-monitoring and cybersecure local and remote status reporting in real time. Complex critical infrastructure facilities such as an electrical substation or a power generation plant, requires the installation of SPDs at multiple points and with multiline configurations. The need to use multiple SPD in clustered installations with the ability for remote status display at a centralize location requires the capability for remote monitoring of the status without introducing or compromising the overall cybersecurity of the infrastructure. Pertinent electrical design parameters for EMP protection are combined with additional status self-monitoring and reporting in real time. The detailed description for each method is beyond the scope of this application. EMP protection implementations are described in the referenced related applications including novel solutions providing enhanced EMP protection.

The main purpose of the current application is to provide protection to the monitored system (infrastructure, in general) with a real time persistent status monitoring of the SPDs from a central portal in a cybersecure manner (hacker-proof deployment). The protective system based on the present invention detects and protects the connected systems by limiting, shunting, and absorbing the energy of the surge transient pulses before they can reach the input ports of the protected infrastructure. The present invention recognizes that the teaching of the referenced related patent applications can be extended and used to "time stamp" the occurrence of a HEMP or an IEMI event (or other high-voltage transient pulses) and to report the detection to a remote portal for real time status display and historical events log. This "time stamp" of the event is device and line specific due to the unique identification of each SPD. The historical profile can be used for preventive maintenance, an improved reliability, and overall enhanced resilience of the protected infrastructure.

SUMMARY OF THE INVENTION

Embodiments of the invention are defined by the claims below and not solely by this summary. A high-level overview of various aspects of the invention are given here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes a novel and enhanced system for monitoring, detecting, and responding to electromagnetic pulse induced electrical surges associated with a multi-pulse radiation complex generated by the detonation of a nuclear weapon (NEMP) or IEMI. Among other things, the application describes a system and method for EMP protection using a real time self-monitoring with local display and a cybersecure remote report communication for the status of the protected infrastructure and the protection device.

In one aspect, the system and method for suppressing electromagnetic pulse-induced surges on an electrical system comprises a plurality of voltage and current magnitude limiters and shunts placed between, and in electrical communication with, a plurality of power lines in an electrical system, such that common mode and differential mode voltages on electrical power lines that exceeds a predetermined level are limited and shunted by at least one of the plurality of surge protection components (SPCs) to prevent the voltage amplitude from exceeding a predefined desired level.

In another aspect, the response time of the plurality of shunts and the allowable voltage amplitude level of the SPCs are selected and combined to achieve a predefined desired response time and protection level capacity to react to and mitigate the E1, E2, and E3 components of a complex multi-pulse event generated by detonation of a nuclear weapon at high altitude (HEMP). In a similar aspect, the response time and the voltage limiting and energy handling capacity of the plurality of shunts responds to intentional electromagnetic interference (IEMI).

In a further aspect, the system and method protect line-to-line, line-to-neutral, neutral to ground, and line-to-ground arrangements of an electrical system's power lines, as well as combinations and sub-combinations thereof forming an SPD based on plurality of SPCs.

In alternative embodiments, the system and method of the present invention are configured to protect single-phase and three-phase land-based electrical systems, in further alternative embodiments the system and method are configured for use on alternative electric power generation systems (solar, wind, fuel cell) and the electrical systems of vehicles, such as automobiles, trucks, locomotives, boats, aircraft and other vehicles employing on-board electrical systems.

It is understood that the current application solves the limitations and constraints associated with the existing SPD that have front panel visual LED and/or audible indicators to display normal and fault/alarm status. The system and method according to the present invention provides protection to AC and DC power lines with an enhanced self-monitoring status and local and remote status indication. The self-monitoring and annunciation are implemented with analog electronic circuits and the status conditions are communicated in real time to a remote location using an electro-optical channel with controlled directionality. The regular operation with one-directional communication provides an inherent cybersecure network configuration for critical infrastructure installations with multiple distributed and clustered surge protection devices. The importance of the implemented cybersecure remote communication is the provision to deploy multiple SPDs within the perimeter of a critical infrastructure and monitor the status of all protected locations including the status of the protected lines and the protecting devices. This application provides a solution for distributed installations at large critical infrastructures such as a power generation facility (nuclear power plants, electrical grid substation, solar and wind generation power farms), a military base, a large datacenter, and an industrial complex. The net result is an improved EMP resilience with real time situational awareness for the status of the protected infrastructure.

More particularly, the present invention provides a solution for protection of a single-phase and three-phase AC circuits. The method provides scalable implementations for different AC and DC voltage electric lines. FIG. 12 presents an overall view of an SPD installed on a three-phase electric power line. As can be seen, the SPD consists of multiple surge protection components (SPCs) mounted between each phase line (Ph1-Ph2, Ph1-Ph3, Ph2-Ph3) and between each phase line and the neutral line (N), and each phase line and ground (GND). When necessary and depending on the location of the ground connection, additional SPC may be connected between neutral (N) and ground (GND) lines. For simplicity, a single symbol of a SPC is used to represent a single possible type or multiple types of components in different combinations and configurations. There are many possible designs of an SPD with respect to the voltage threshold limiting levels and shunting capacity of the components, The variety of implementations are not the focus of the current application.

FIG. 13 is a block-diagram representation of an SPD installed on the electric power line powering the protected device. In general, the electric power line can be an AC or a DC supply line. The new and important part is the presence of a communication channel for remote status report (display) which is shown with the one-directional arrow.

FIG. 14 displays the block-diagram of one possible implementation of a protection system based on the present application. In the given example, it is an SPD with an embedded AC-DC converter, local status display and remote annunciation display.

FIG. 15 illustrates details of the embedded AC-DC converter (DC power supply) with block-diagram representation of the DC power distribution, super-capacitor charging module and a power switch circuit, which automatically continues to provide DC power when the input AC electrical power on all phases is lost or disconnected. The block-diagram in FIG. 16 illustrates the functional subsystems implemented with analog circuit for self-monitoring and local display of the SPD and the power lines. FIG. 17 presents an implementation of a system that includes a level conversion circuit (LCC) from high voltage to low logical levels that can be further processed by a microcontroller and a message generating subsystem with an output optical communication channel and a secondary alternative communication channel described further in the text that follows. FIG. 18 displays details of the system transceiver module for the optical communication channel and elements of the remote display modules used to provide a cybersecure communication channel.

FIG. 19 displays some of the circuit details of the analog sense and local display subsystem and will be used to describe further the cybersecure self-monitoring and remote display functions of the current application. The annunciation functions for the system's status conditions are presented in the table in FIG. 20. The expanded status display functionality includes: 1) individual line (phase) normal status indication; 2) per line fault condition indicator which also triggers an overall alarm; 3) loss of power per line (phase); 4) loss of connection to electrical ground; 5) intermittent indication of complete power loss.

BRIEF DESCRIPTION OF THE DRAWINGS

Illustrative embodiments of the invention are described in detail below with reference to the attached drawing figures, where some of the figures (from FIG. 2 to FIG. 10) are related to the physical phenomena associated with a NEMP, and wherein:

FIG. 6 is a tabulated summary of the commonly used analytical expressions for the HEMP E1, E2, and E3 waveforms with the model parameter values;

FIG. 7 is a table with the HEMP E1 waveform parameter values and their changes as the models and standards describing the HEMP E1 environment have evolved;

FIG. 8 is a table with additional HEMP E1 waveform parameters in time domain, its energy, and spectral characteristics;

FIG. 9 is a graphical representation of the most common analytical expressions for E1 HEMP-the Difference of Double Exponential (DEXP) and the Quotient of Exponentials (QEXP). The DEXP and QEXP plots in time domain are presented on the left and their respective spectral distribution in frequency domain are presented on the right side of the figure;

FIG. 20 is a table with the summary of all possible status conditions and their respective visual and sound alarm indications.

DESCRIPTION OF THE PREFERRED EMBODIMENT

Figure 1:
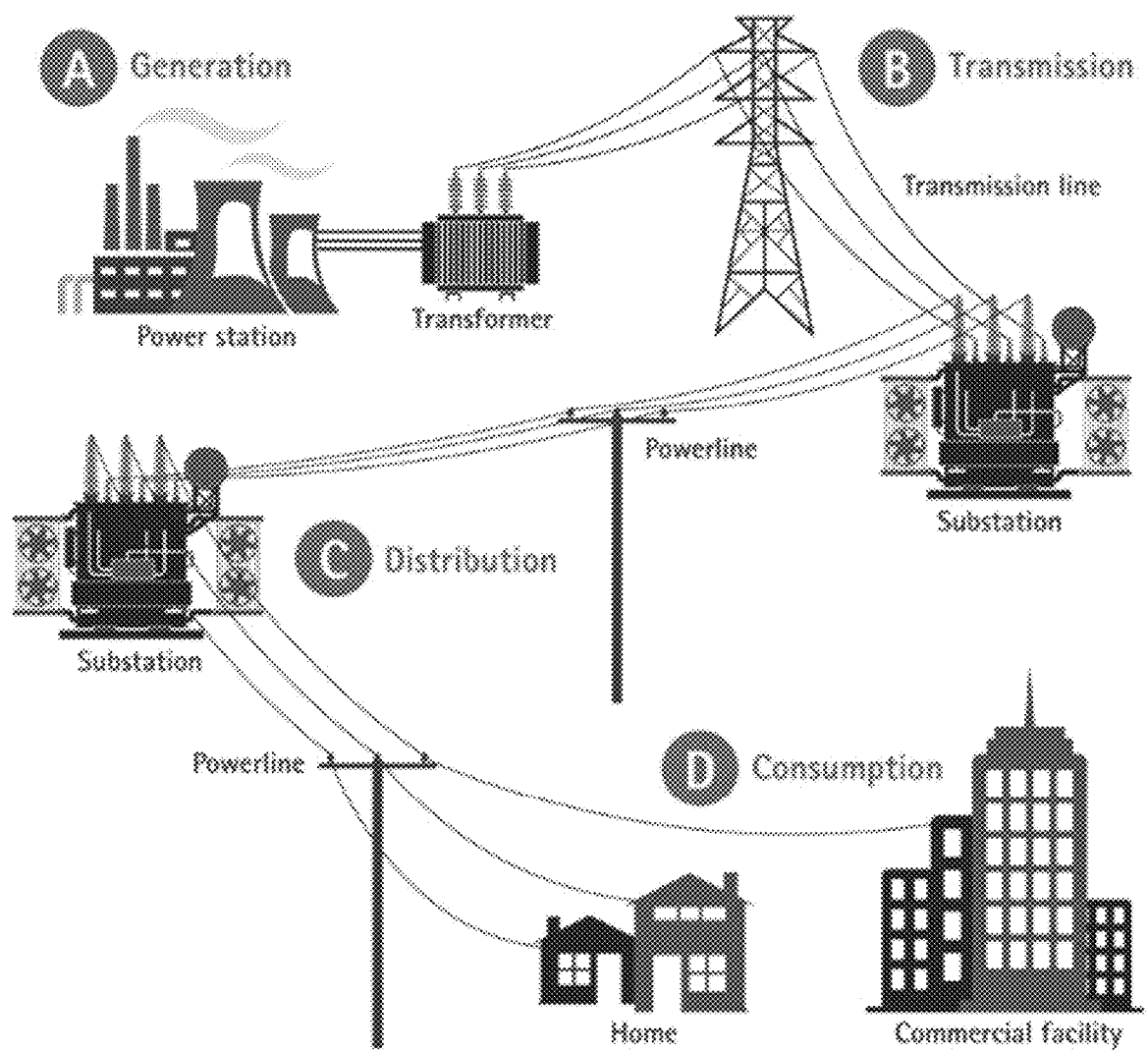
FIG. 1 is a view diagram of an electrical grid segment presenting the generation, transmission, distribution, and consumption components which will be part of the infrastructure subject of protection by the present invention.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

Before the present invention regarding a method and systems for detecting and responding to an electromagnetic pulse so as to protect a monitored infrastructure can be described in detail and in context, a deeper understanding of the characteristics of an EMP, in general, and HEMP, in particular, will be discussed in the context of traditional electrical environments and setups.

As initially presented above, an EMP generated by detonation of a nuclear weapon at a high altitude in the atmosphere, comprises a sequence of waveforms due to the multiple and complex interactions of the products of the nuclear blast with Earth's atmosphere and geomagnetic field. Three phases (pulses of varying duration) are used to describe/represent the HEMP more accurately. In this regard, the HEMP is considered a complex, electromagnetic multi-pulse, usually described in terms of three primary components defined by the International Electrotechnical Commission (IEC) as E1, E2, and E3. The three phases of the HEMP are presented in FIG. 5a in time domain and their respective time sequence, individual duration, and magnitude is presented in FIG. 5b. The nature of these pulses is described further below.

The E1 component of the complex multi-pulse is produced when gamma radiation from the nuclear detonation knocks electrons out of the atoms in the upper atmosphere. The electrons begin to travel at relativistic speeds (i.e., at more than 90 percent of the speed of light). In the absence of a magnetic field, the displaced electrons would produce a large pulse of electric current in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very brief, but very high magnitude, electromagnetic pulse over the affected area, which area size (respectively, radius from point zero under the nuclear explosion) depends on the altitude of the nuclear detonation.

The process of gamma rays knocking electrons from the atoms in the mid-stratosphere ionizes that region, causing it to become an electrically conductive ionized layer, that limits and blocks the further expansion of the electromagnetic signals and causing the field strength to saturate at about 50,000 volts per meter (50 kV/m). The field strength of the E1 HEMP depends primarily on the altitude of the detonation of the nuclear device, the yield and intensity of the gamma rays produced by the weapon, and the geographic latitude (due to the changes of the Geomagnetic field with latitude). The atmospheric conditions, and the conductivity of the Earth's surface also play roles. The more detail explanations of the undergoing physical interactions are beyond the scope of this document and may be found elsewhere.

The interaction of the very rapidly moving, negatively charged electrons with the Geomagnetic field radiates a short duration, intense pulse of electromagnetic energy. The pulse typically rises to its peak magnitude in about five nanoseconds (5 ns) and decays within hundreds of nanoseconds (200 ns-500 ns, depending on the intensity level used for measurement threshold). The given values may vary based on location and distant to the blast point. According to the most recent IEC standard update, the E1 pulse has a rise time of 2.5 ns±0.5 ns (from 10% to 90% amplitude levels of the rising edge of the pulse), reaches peak value of 50 kV/m in 5 ns, and has a pulse width at its half maximum of 23 ns±5 ns (FIG. 6, FIG. 7, FIG. 8, and FIG. 9).

Thus, the E1 component is a short-duration, intense electromagnetic pulse capable of inducing very high amplitude voltages in electrical conductors. That induced high voltage typically exceeds the breakdown voltage values of common electrical system components, such as those used in electronic and communication equipment, degrading and/or destroying those components. Because of the extreme parameters of E1 pulse, most commonly available lightning surge protectors are unable to respond and suppress the transient surges induced into an electrical system by a HEMP E1 pulse. Respectively, new technologies and components with improved response characteristics are constantly developed in order to provide an adequate solution.

The HEMP E1 component is characterized in multiple regulatory standards. The first HEMP related standard was created by Bell Labs in the 1960s. Since then, revisions have been made, as can be seen from the Table in FIG. 7. In general, the given parameter values do not represent the variations with respect to altitude, geolocation distance, atmosphere conditions, field vectors direction, and local Earth surface properties, which impact the formation, propagation, and reflection of the EM field. The Table in FIG. 8 gives a better understanding for the temporal and energy characteristics of the E1 phase of the HEMP. There are several HEMP environment standards, and some are classified such as DoD-STD-2169. Others are in public domain, such as IEC STD 61000, MIL-STD-188-125-1, MIL-STD-461G, and MIL-STD-464C.

Two of the well accepted and used analytical expressions of HEMP are provided in IEC 61000-2-9 and given for a reference in FIG. 9. The combined HEMP timeline based on analytical expressions is provided in IEC 61000-2-9 and is given in FIG. 10. Unclassified HEMP standards characterize the E1 phase of the EMP by idealized Difference of double exponentials (DEXP) and quotient exponential (QEXP) waveforms, as shown in the left side plot in FIG. 9 with the blue solid line and the red dash-dot line, respectively. The plot on the left side in FIG. 9 displays the HEMP E1 model waveforms in time-domain and their respective spectral content is presented on the right plot. The evolution of the E1 HEMP standards is presented in FIG. 7. The $\alpha$ and $\beta$ are the exponential constants and k is a normalizing constant for the peak amplitude at the cross section of the two exponentials. In addition to the DEXP and QEXP, two other analytical forms have been developed and presented in the literature: the P-index exponential (PEXP) and the Complimentary error function (ERFC). The main reasons for these additional analytic models are some of the deficiencies of the first two models. For example, the DEXP model is discontinuous at t=0, while QEXP extends to t=∞) and has an infinite number of poles in the frequency domain. Further details for the model waveforms are presented in the relevant literature and the referenced related applications.

The method and devices based on the method described in this invention application for EMP surge protection are based on specifications listed in the Military and Civilian Standards and are developed accordingly for accurate description of E1, E2, and E3 pulse components of a HEMP. The standards are used to design the SPDs and to test their performance and to design, implement, and evaluate the level of protection of devices built for mitigation of the effects.

This application recognizes the importance of real time situational awareness for the overall status of a protected large scale critical infrastructure. The application provides solution with persistent status monitoring and communication to a remote display to form a centralized portal for plurality of SPD based on the proposed method. Furthermore, the communication channel is optical and immune to EM1. The default regular operation is based on a one-directional communication from the distributed SPDs to the remote display location, resulting in an ultimate cybersecure implementation. The real time status reporting provides an enhanced situational awareness for the protected critical assets.

The referenced figures describe the physical phenomena associated with the formation of a HEMP and the provided solutions for protection from the impact of the HEMP and IEMI effect with additional capability for expanding the installation of plurality of SPDs with capability of cybersecure networked configuration and situational awareness for the status of large-scale critical infrastructure.

Looking to FIG. 1, the different segments of the electrical grid are displayed as the potential objects of a HEMP impact and the need for their protection.

Figure 2:
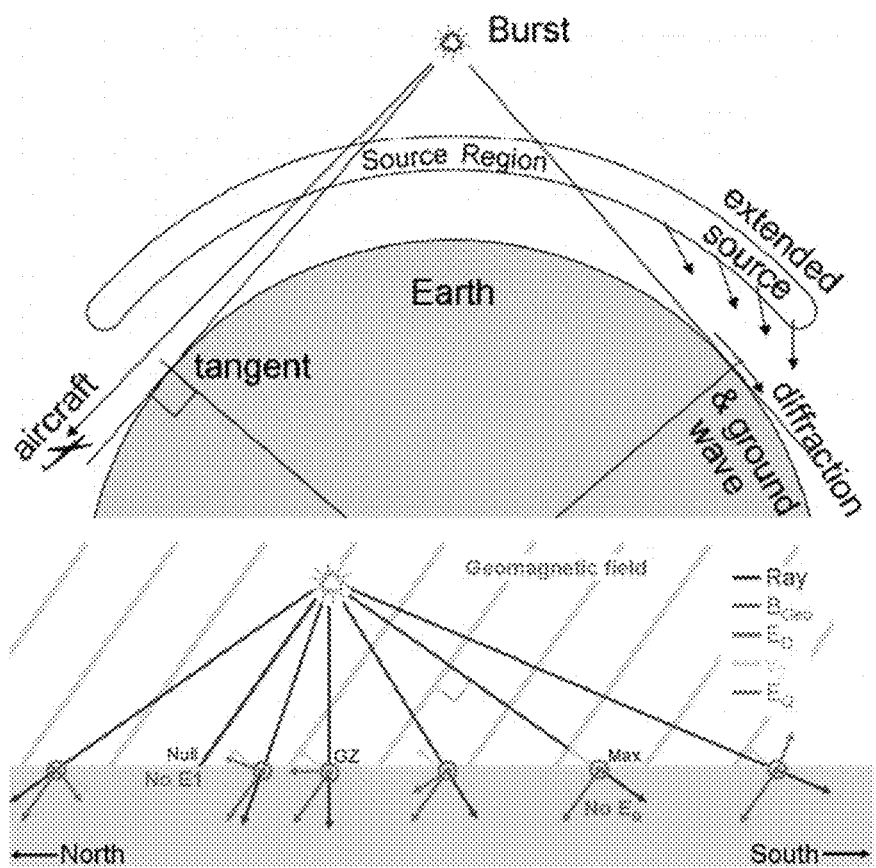
FIG. 2 is an illustration of the formation of the HEMP's source region in the Earth's atmosphere and the formation of the HEMP based on the interactions of the high-energy gamma rays with the atoms and molecules in the atmosphere and the produced electrons which interact with the Geomagnetic field.

Looking to FIG. 2, an instance of EMP wave formation is presented, including its atmosphere source region, its spatial distribution and variability with respect to the source and observer locations.

Figure 3:
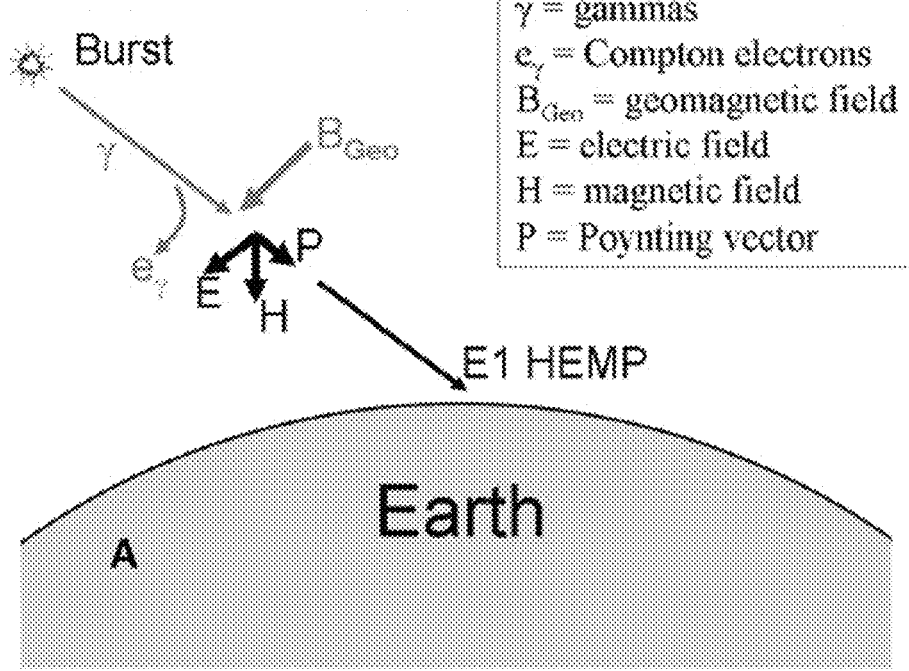
FIG. 3. is a pictograph of the nuclear burst high-altitude location and the Electromagnetic Field (EMF) Poynting vector direction with respect to an observer's location.

Looking to FIG. 3, the 3D spatial orientation of the EMP field direction of incidence from the source towards the observer is presented with the EM field Poynting vector, which is normal to the EM wave plane of incidence, formed by the orthogonal vectors of the electric field (E) and the magnetic field B) components.

Figure 4:
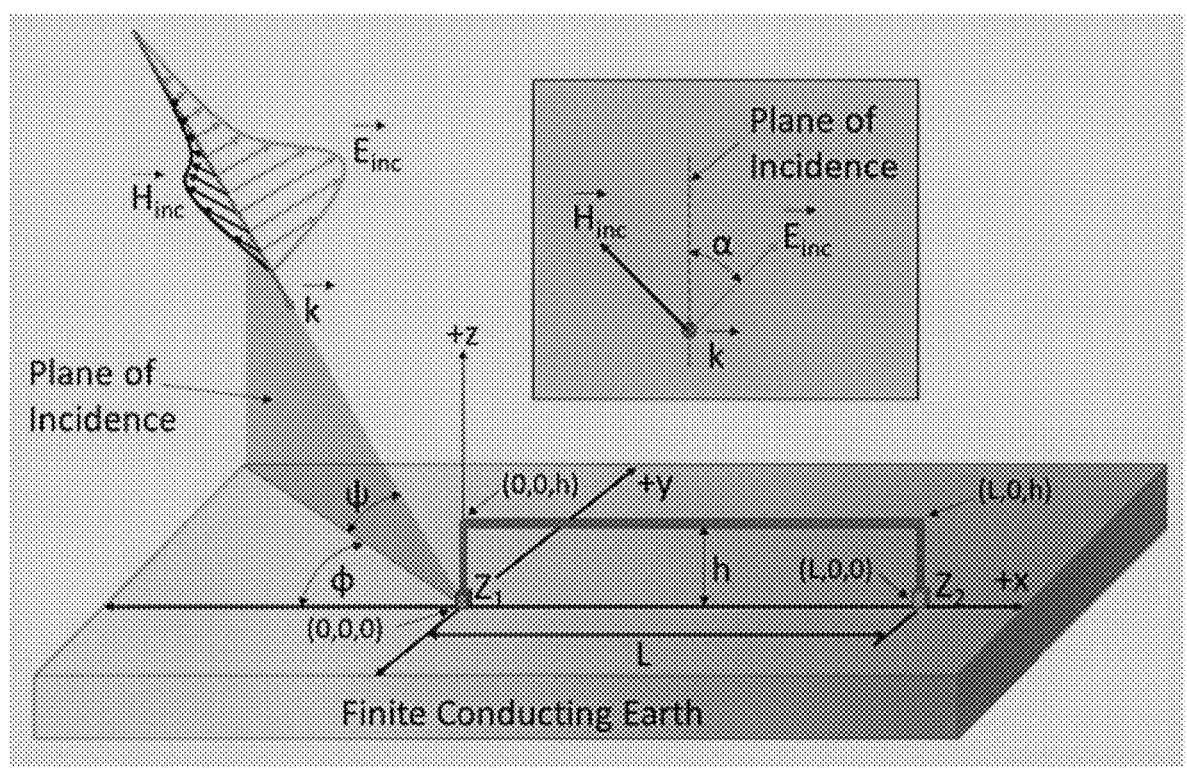
FIG. 4 is an illustration of the EM wave and its E (electric) and H (magnetic) vectors in the plane of incidence at a wire at height h above the Earth's surface with a finite conductivity and three associated angles ($\alpha$, $\phi$, and $\Psi$) used for modeling and simulation of the HEMP coupling to a transmission line.

Looking to FIG. 4, additional Geospatial relations are presented, which are used to model, calculate, and simulate the interactions of the EMP with the target of interest, which in this case is a segment of an electrical transmission line with a length L at h height above a finite conducting ground surface and terminated at bought ends with impedances $Z_1$ and $Z_2$. While the pictograph can be used for calculations, in must be complemented with additional factors when higher precision is required. Even under the ideal assumption of a dipole Geomagnetic field, there are variation of the B field along the gamma ray path from the nuclear blast. However, the conditions are more complex due to the motion of the Compton electrons and the nonhomogeneous Geomagnetic field. Assuming a uniform Geomagnetic field is equivalent to assuming the Earth radius is extremely large, or the burst height is very low, which is known as a source region EMP (SREMP).

Figure 5A:
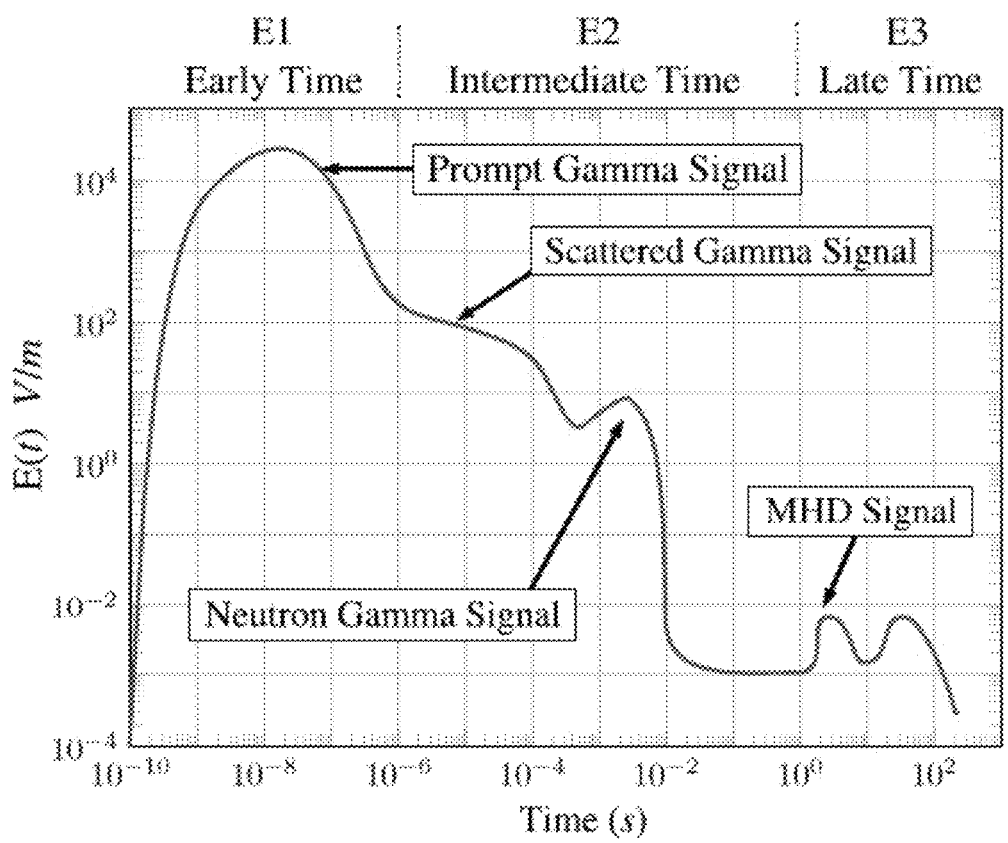
FIG. 5a is a plot representation in time domain of the complex high-altitude electromagnetic multi-pulse event with a sequence of the three primary phases of the HEMP: E1(Early time), E2(Intermediate time), and E3 (Late time)

Looking to FIG.5a, the complexity of HEMP is presented in terms of sequence of three primary components E1, E2, and E3, shown in logarithmic scales of the electric field intensity (V/m) and time (sec). Labels indicate the physical phenomena that produce the pulse waveforms components. HEMP is more accurately described and presented as a multi-pulse (multi-phase) electromagnetic event.

Figure 5B:
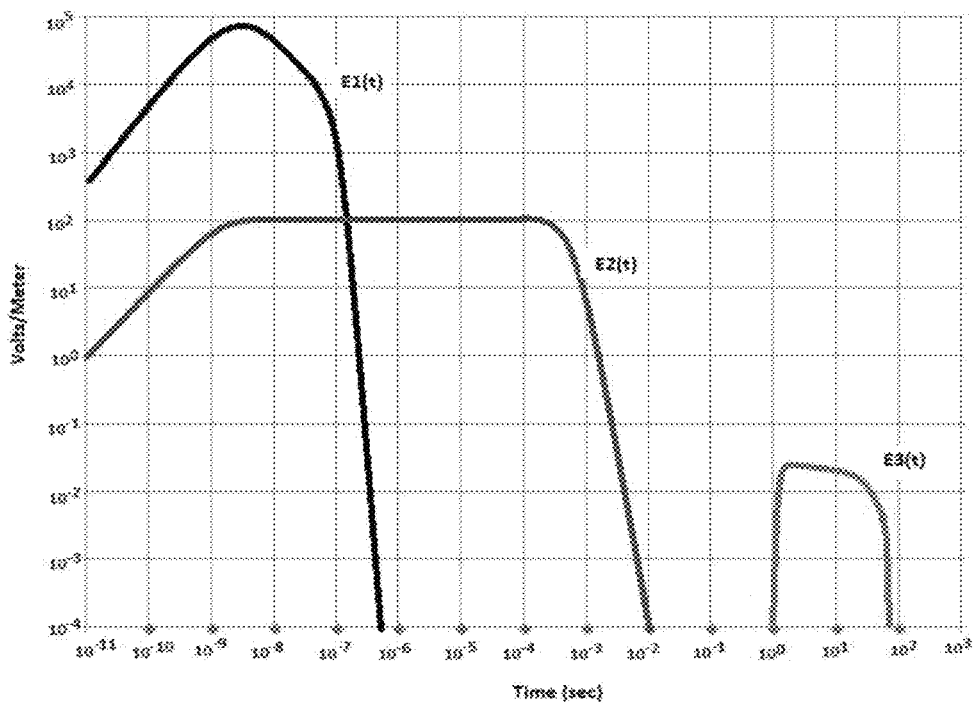
FIG. 5b is a plot representation in frequency domain of the spectral content and spectral magnitude of the three primary E1, E2, and E3 phases of the HEMP.

Looking to FIG. 5b, the respective time sequence, relative individual duration, and magnitudes of E1, E2, and E3 is presented.

Looking to FIG. 6, the analytical expressions and the numerical values of the parameters for the waveform models of the HEMP Early time E1, Intermediate time E2, and Late time E3 are presented.

Looking to FIG. 7, the evolution of the standards for E1 HEMP environment is presented with the time domain values for the waveform analytical models.

Looking to FIG. 8, additional information for the IEC E1 HEMP waveform properties is listed with the associated time domain waveform parameters, spectrum peak power, total energy and others.

Looking to FIG. 9, the two most common analytical expressions and waveforms for HEMP E1 are displayed in time domain (left plot) and their spectrum in frequency domain (right plot).

Figure 10:
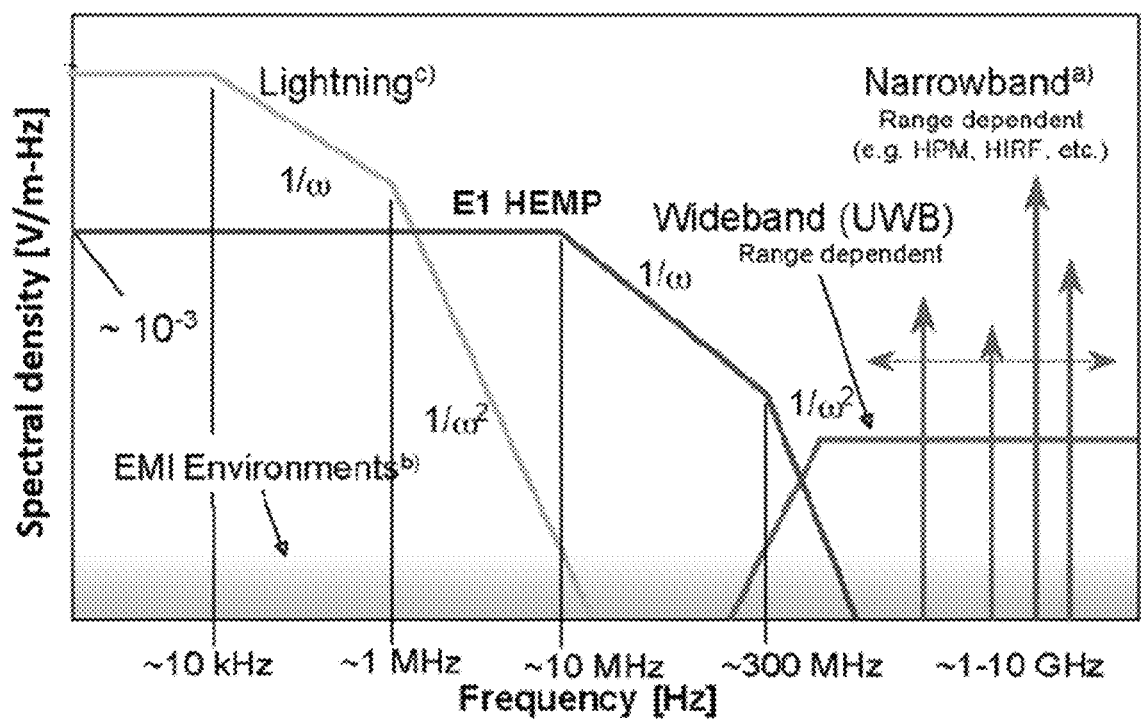
FIG. 10 is a graphical comparison of the magnitude and bandwidth of the power spectrum densities (V/m-Hz) associated with a HEMP E1, an atmospheric lightning, and different narrowband and ultrawideband IEMI (high-power electromagnetic radiation, high-intensity radiofrequency, etc.)

Looking to FIG. 10, the superimposed plots of spectral density distributions are displayed for an E1 HEMP, an atmospheric lightning, high-intensity radio-frequency sources, and intentional electromagnetic interference (IEMI) sources with wide-band and narrow-band examples.

Figure 11:
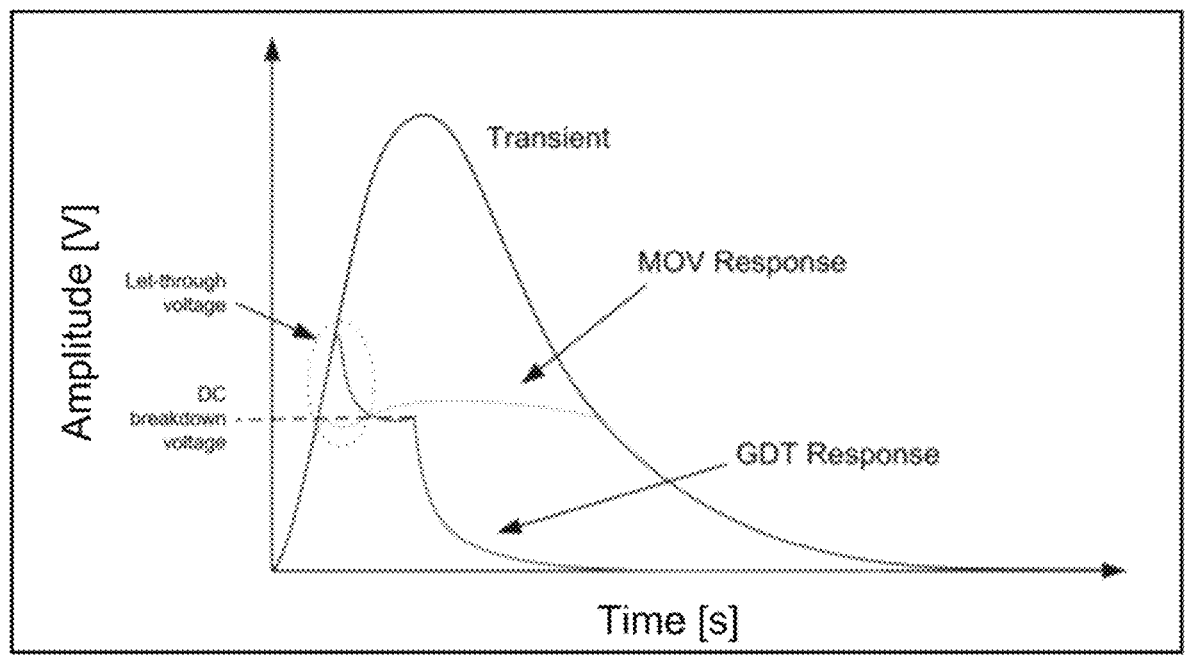
FIG. 11 is a graphical presentation of three superimposed plots illustrating a surge transient waveform, the limiting threshold level response of a metal oxide varistor (MOV), and the typical crowbar shunting response of a gas discharge tube (GDT)

Looking to FIG. 11, three superimposed plots are displayed, illustrating a surge transient waveform, the limiting threshold level response of a metal oxide varistor (MOV), and the typical crowbar shunting response of a gas discharge tube (GDT).

Figure 12:
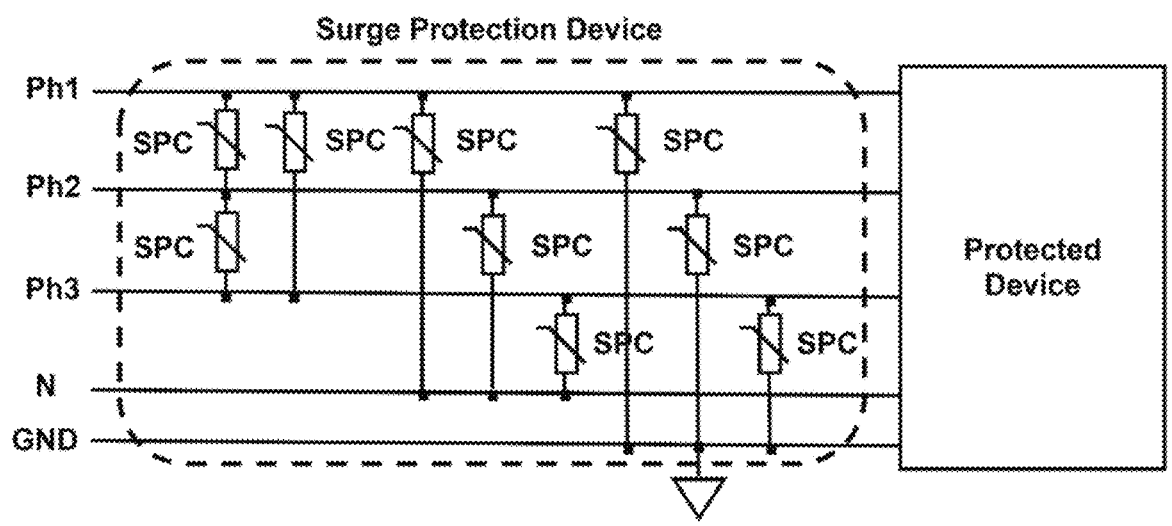
FIG. 12 is a schematic of a general case surge protection device (SPD) installation on a three-phase electrical power line with surge protection components (SPCs) connected between each phase line, each phase line to neutral, and each phase line to ground.

Looking to FIG. 12, a generalized schematic of a surge protection device (SPD) installation is presented with plurality of surge protection components (SPCs). An example, using a three-phase AC electrical power is displayed. Multiple SPCs are connected between each phase line (Ph1-Ph2, Ph1-Ph3, and Ph2-Ph3), each phase line and neutral (N), and each phase and ground (GND). The schematic represents a generalized methodology for differential and common mode protection implementation. For clarity, individual SPCs are used to represent any of the different type components connected individually or in plurality of components configurations and combinations.

Figure 13:
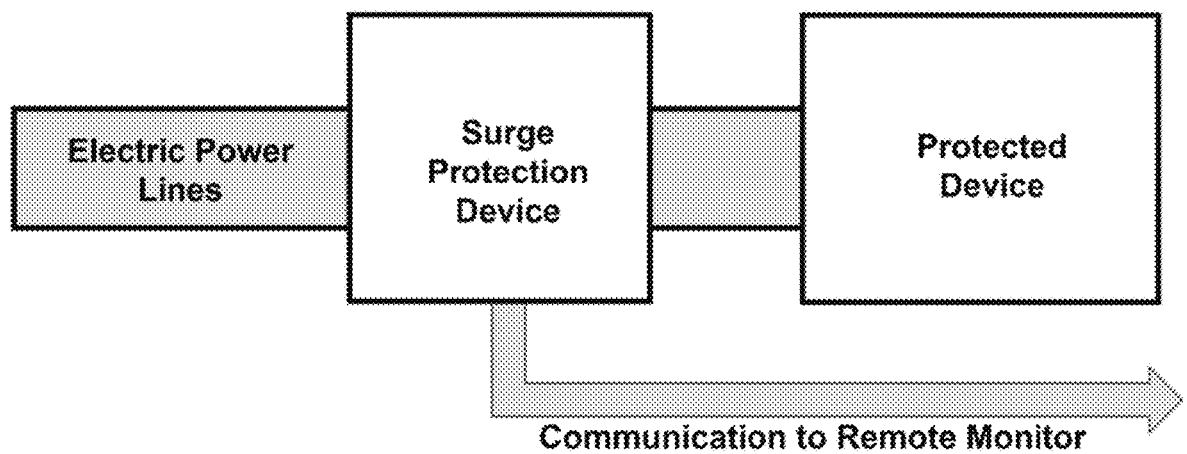
FIG. 13 is a block diagram representation of an SPD with an output communication channel installed on the electrical power supply of the protected device.

Looking to FIG. 13, a block-diagram of an SPD installed on an AC electric power line is displayed. As shown, the SPD protects a device powered by the same AC power line. A wide arrow indicates an output communication channel to a remote display portal.

Figure 14:
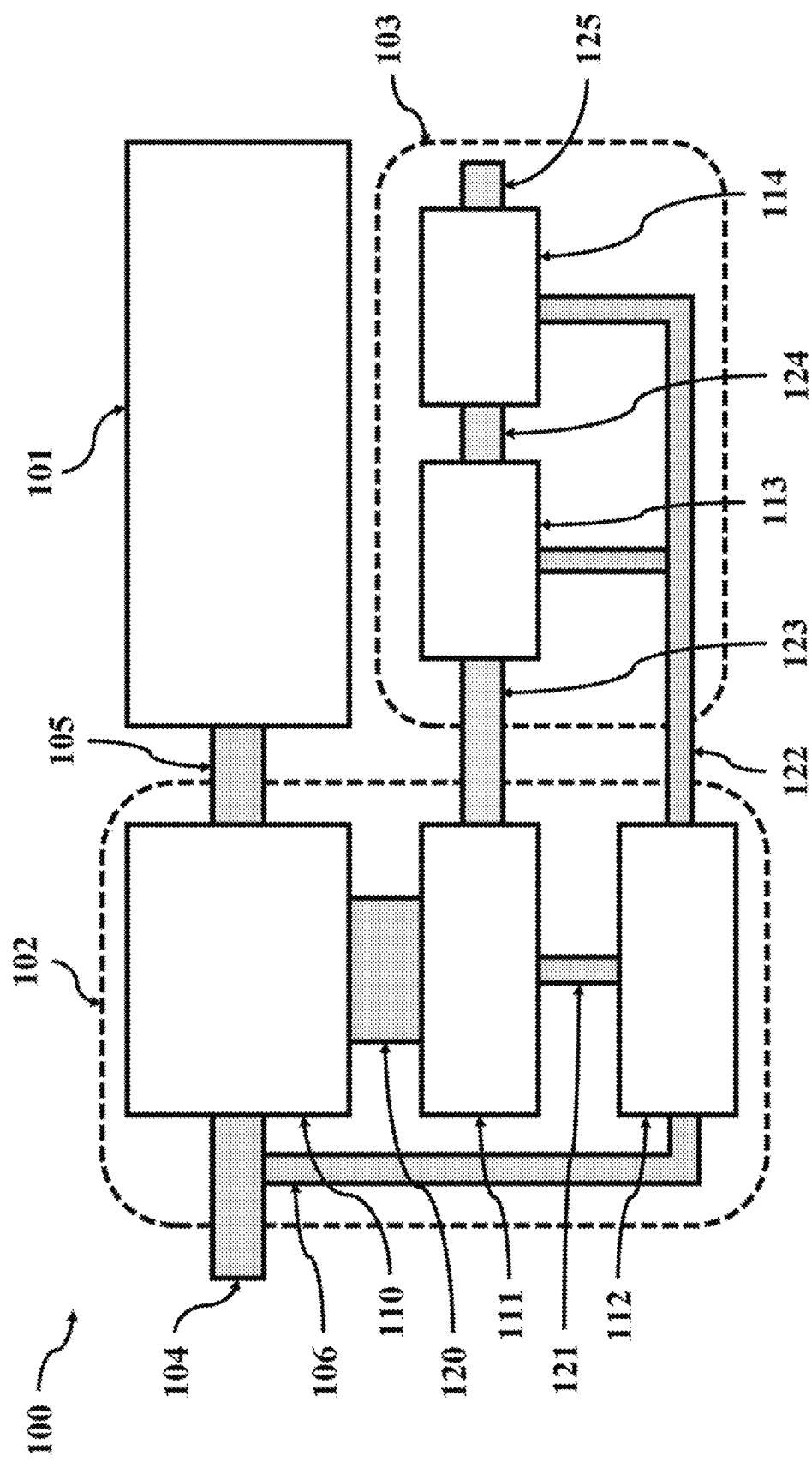
FIG. 14 is a block diagram of subsystems and modules of an exemplary implementation of an EMP protection system with persistent status monitoring and cybersecure local and remote status reporting in real time.

Looking to FIG. 14, a high-level block diagram 100 is used to present one possible implementation of a surge protection device (SPD) based on the current application. A protected device 101 is powered by an AC electric power source 104 with multiple lines for each phase, neutral line, and ground line. A surge protection device (SPD) 102 is mounted on the same electric power line 104 and has three submodules: plurality of high voltage surge protection components (SPCs) and additional high voltage subcircuit components 110, an analog sensors and display (ASD) subsystem 111, and a DC power supply module 112. Analog sensor circuits of ASD 111 are connected to the AC power lines 104, some of the SPCs of 110, and additional high voltage subcircuit components of 110. A dedicated high voltage bus 120 connects all monitored circuit points to all respective analog sensors and display indicators of ASD subsystem 111. A DC power supply 112 is connected to the input AC power line 104 by a bus 106 and provides DC voltage to the ASD 111 via a DC supply line 121, and to a level converter module (LCM) 113 and a digital controller and communication (DCC) module 114 via a DC power distribution supply line 122.

Figure 15:
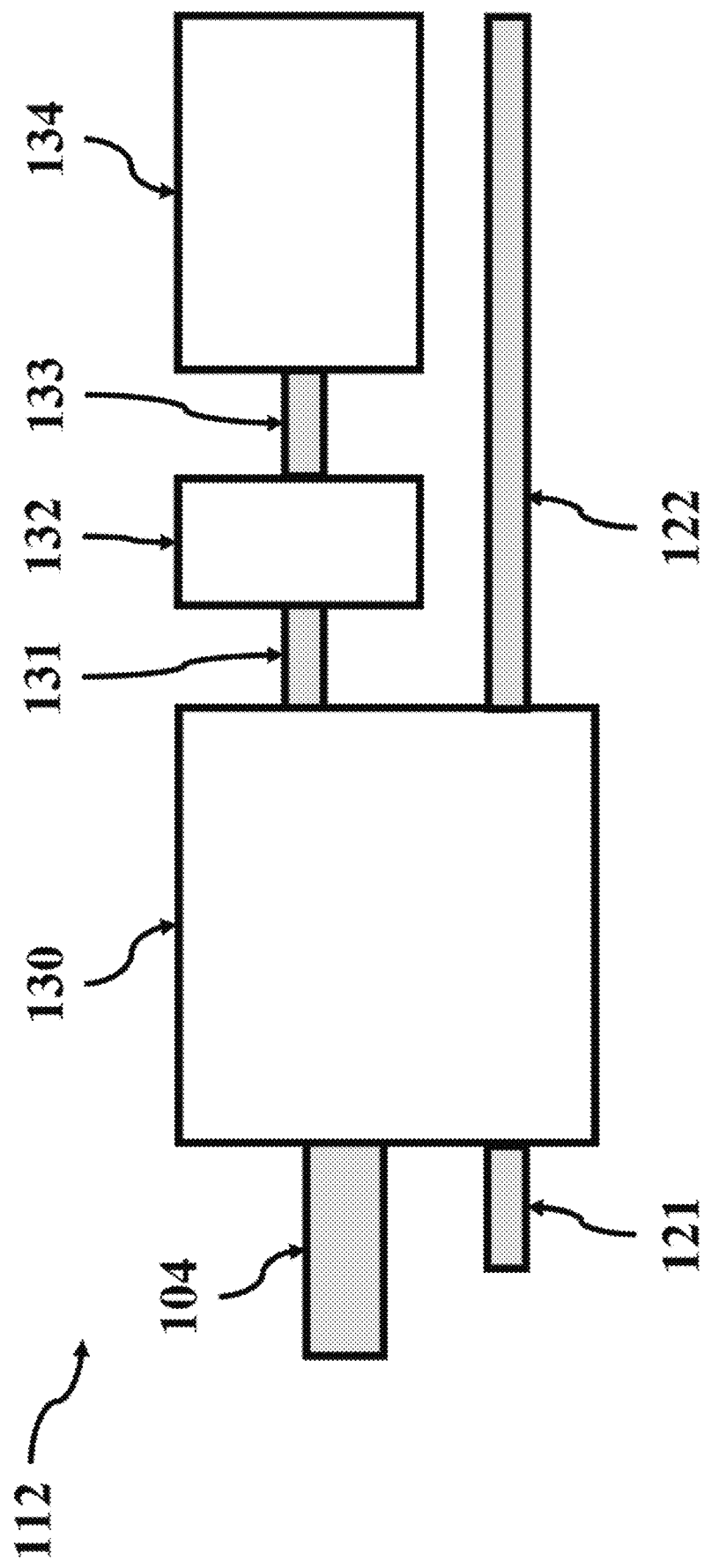
FIG. 15 is a block diagram presentation of the DC power supply subsystem, the DC distribution bus, the supercapacitor charging circuit, and the automatic switch circuit for a backup DC power when the input AC power is lost.

The LCM 113 and the DCC module 114 form a subsystem for remote display (SRD) 103. A high voltage bus 123 connects the ASD subsystem 111 to the LCM 113. A logical level bus 124 connects the LCM 113 to the DCC module 114. A communication channel 125 is the physical connection to a remote location display. A subsystem for remote display (SRD) 103 provides the cybersecure communication solution for a system based on the current application for protection of electrical and electronic infrastructure from EMP with persistent self-monitoring and remote status report. Looking to FIG. 15, submodules of the DC power supply 112 are presented. An AC to DC conversion subsystem 130 has an. AC-DC convertor section for each input AC power line 104. All DC outputs of the AC-DC convertor sections are combined to assure a DC power when one or more of the input AC lines lose power or is disconnected (loss of a physical connection, a thermal fuse or a current-limiting fuse disconnect). The DC power is distributed to the rest of the subsystems via the DC distribution buses 121 and 122, as described previously. The DC power line also connects to an auto-transfer switch (ATS) circuit 132 via DC power bus 131. The ATS 132 connects to a super capacitor module (SCM) 134 via a DC power line 133. As the name implies, the SCM 134 has a supercapacitor for energy storage and a charging circuit. A complete loss of power on input AC power lines 104 results in a loss of DC voltage at the output of the DC power supply 130, which triggers the ATS 132 to provide power from the SCD 134 via DC power line 133 and DC power bus 131 to the DC distribution buses 121 and 122.

Figure 16:
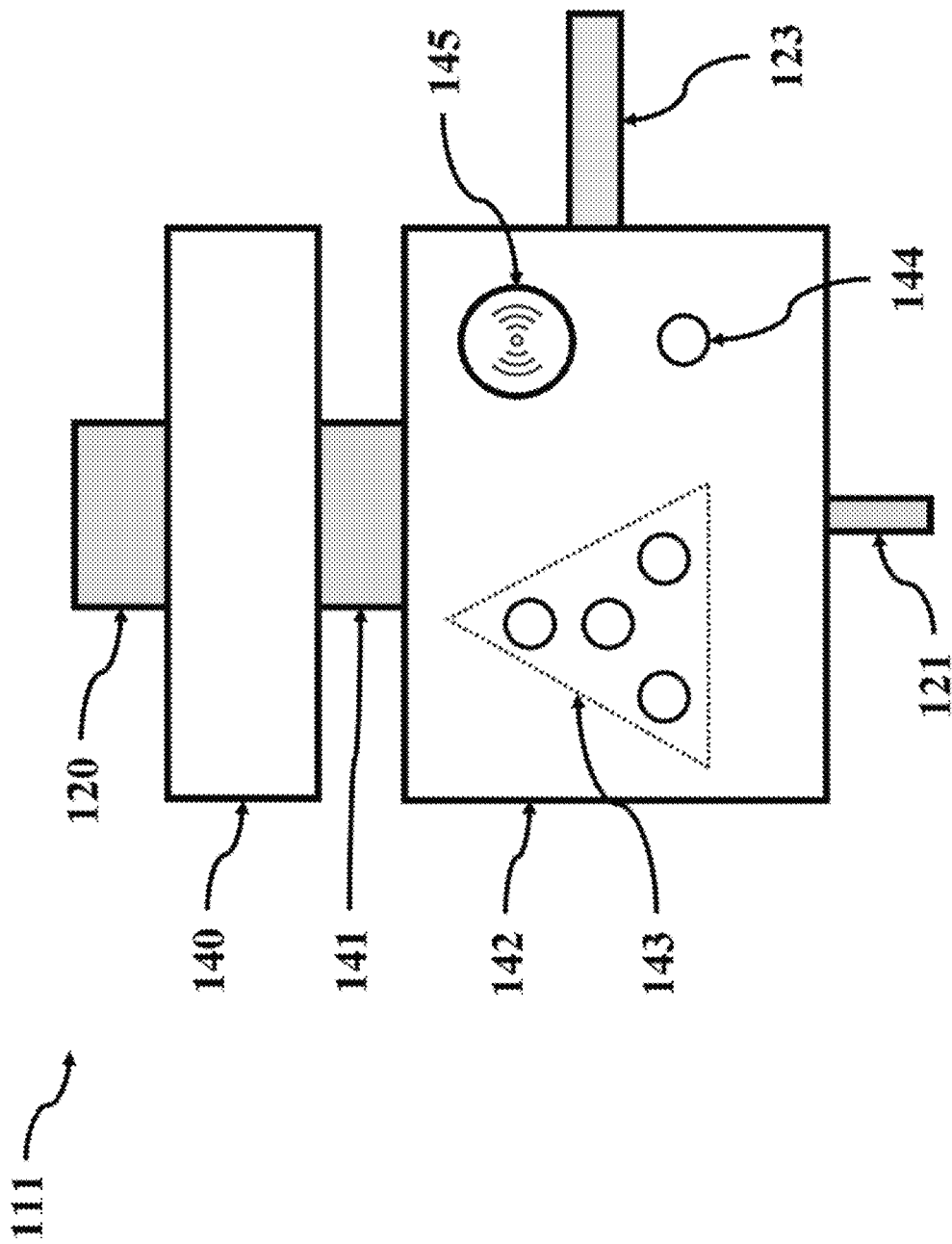
FIG. 16 it is a block diagram schematic of the analog power lines status sensors and the respective front panel local visual displays and sound alarm.

Looking to FIG. 16, details of the analog sensors and display (ASD) subsystem 111 are presented with a block diagram. Multiple sections of analog sensor circuits 140 of the ADS subsystem 111 are connected by a dedicated high voltage bus 120. The details for the high voltage sections 140 are described further below. Each high voltage section of 140 is associated with a respective subset of the AC power lines 104 and consist of analog circuits that connect to monitored SPCs of 110 mounted on the associated AC power lines 104 and any additional monitored high voltage circuit components of 110. The analog sensor circuits 140 convert the state of monitored components to signals transferred via a connecting signal bus 141 to drive visual and sound indicators of an annunciation display module (ADM) 142. The high voltage bus 123 connects the annunciation display module (ADM) 142 of the ASD subsystem 111 to the level converter module (LCM) 113, as shown in FIG. 14.

In the given example, visual annunciators are presented as light emitting diodes (LEDs) 143 and 144. In this case, the triangular group of LEDs 143 presents three LEDs each one positioned in the three corners of the group and associated with each one of the three phases of a three-phase AC power line 104 (Ph1, Ph2, and Ph3). The center LED in the group 143, is an LED indicating the normal status (connected) or fault status (loss of connection) to the ground line of the AC power supply 104. The LED 144 is an overall alarm status indicator. An alarm status indication with LED 144 is combined with an audible alarm by a sound source 145. A complete loss of AC input power 104, triggers the ATS 132 to provide a DC power to the annunciation display module (ADM) 142 via power bus 121 from the super capacitor module (SCM) 134, as shown in FIG. 16. The alarm visual indicator 144 and the alarm sound indicator 145 are intermittently activated to indicate "AC power loss" status alarm condition for a prolonged time period, which depends on the stored energy in the super capacitor module 134. The DC power voltage provided to the DC power distribution buses 121 and 122 by the super capacitor module (SCM) 134 is lower than the nominal DC power supply voltage and is used to indicate the "AC power loss" status alarm condition to the remote display and will be described further below.

Following commonly used color schema, the normal status is visually presented with a green color of the LED indicators, which changes to red in case of a fault condition. Without any limitations, additional LED colors may be used to indicate a plurality of possible conditions. This is facilitated by the available multicolor LEDs. The number of LEDs may vary, as necessary, to present indication for each one of the power lines or specific monitored condition. The arrangement of the LEDs is not critical and, in general, is implementation driven. For example, a single-phase AC power supply has two lines (L1 and L2), one neutral line (N), and one ground line (GND) and may use two LEDs for the AC lines, one LED for the ground line connection status, and one LED for an overall alarm indicator. Color legends may be included in the SPD's user manual or displayed on the SPD's label. Currently, different liquid crystal displays, LED, and organic LED display components are available and, without any limitations, may be used in place of the individual LEDs 143 and 144.

Figure 17:
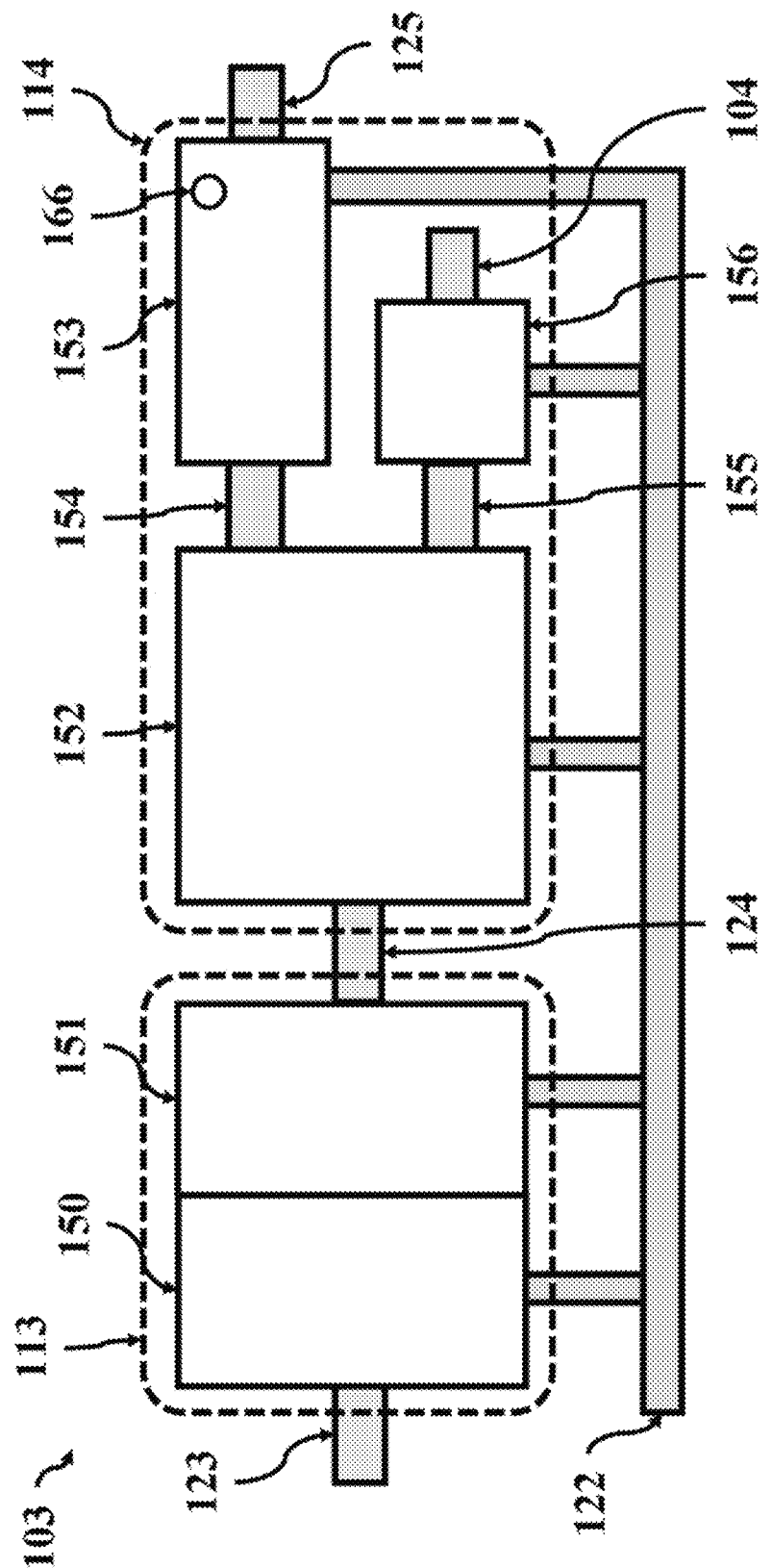
FIG. 17 is a block diagram representation of an example system implementation based on the current application that includes a voltage level conversion circuit (LCC), producing low logical levels from the high voltage levels, for further processing with a microcontroller and a transmitter subsystem with output communication channels.

Looking to FIG. 17, a block diagram is presented with details of the subsystem for remote display (SRD) 103 that provides a cybersecure communication solution. The subsystems of the level converter module (LCM) 113 and the digital controller and communication (DCC) module 114 are displayed. A DC power supply to the subsystems is provided by the DC power supply bus 122. The level converter module (LCM) 113 has two subsystems: a high voltage levels sensor 150 and a high voltage to low logical level converter 151. The high voltage bus 123 connects the input of the LCM 113 to the high voltage level signals at the output interface of the annunciation display module (ADM) 142. The level sensor subsystem 150 of the LCM 113 monitors and measures voltage peak and RMS values of the high voltage bus 123 to provide an auto scale factor to the high voltage to low logical level converter 151. Converted voltage levels at the output of converter 151 are sent to a microcontroller subsystem 152 via the interface logical level bus 124. The microcontroller subsystem 152 is one of the subsystems of the digital controller and communication (DCC) 114 and performs digital processing and communication control. The microcontroller subsystem 152 interfaces to a digital communication transceiver 153 via an interface 154 and a secondary alternative transmitter 156 via an interface 155. The digital communication transceiver 153 communicates with a remote location using the communication channel 125 and an example of a preferred implementation is presented and described further below. The regular communication mode of the communication channel 125 is one-directional communication from the surge protection device to a remote display. This provides an ultimate cyber security for the connected surge protection device. A change to a two-directional communication mode, when needed, is indicated using a multicolor LED 166 and it is further explained below. The secondary alternative transmitter 156 communicates via the interface 104 which may utilize any currently available techniques. One preferred implementation is to utilize the AC power lines for a communication media channel. Implementation of communication over power lines are well known, described in the literature, and have been successfully used. They do have limitations which are recognized in the current application. Nevertheless, for installations with a single or a limited number of surge protection devices, the communication over the power lines provides a viable alternative with an intrinsic security for the necessary status communication to a remote location (for example, from an electric power distribution box to an office). Further explanation of the communication over AC power line is beyond the scope of the current application. It is sufficient to acknowledge that the signaling messages are based on a proprietary analog implementation with the main purpose to provide an alternative secure status communication to a remote location. It is to be noted that the communication over power lines is limited to remote displays mounted on the same AC power lines.

The block diagram of a subsystem for remote display (SRD) 103 displays the cybersecure communication solution for a system based on the current application for protection of electrical and electronic infrastructure from EMP with persistent self-monitoring and real time remote status report. The LCM 113 and the DCC module 114, displayed in FIG. 17, form a subsystem for remote display (SRD) 103. A high voltage bus 123 connects the ASD subsystem 111 to the LCM 113. A logical level bus 124 connects the LCM 113 to the DCC module 114. A communication output channel 125 is a physical connection to a remote location display.

Figure 18:
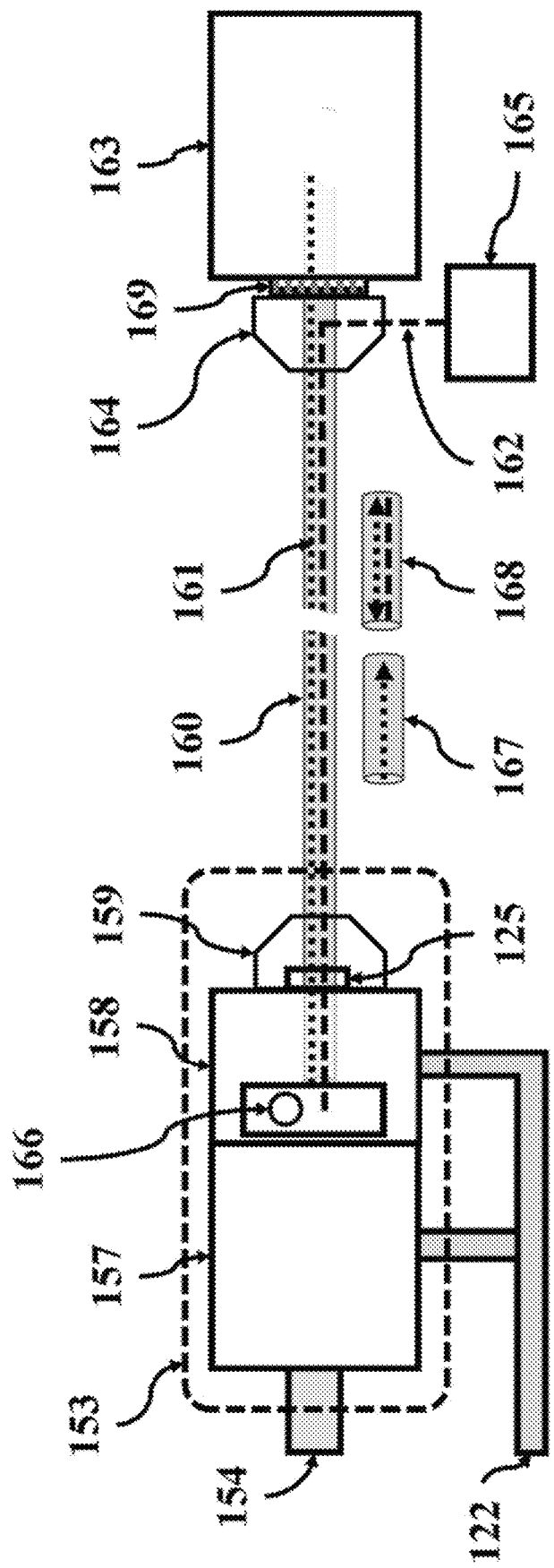
FIG. 18 is block diagram of the system transceiver module for the optical communication channel and elements of the remote display modules used to provide a cybersecure communication.

Looking to FIG. 18, a more detail block diagram of the digital communication transceiver 153 is presented with an example of cyber secure communication to a remote location (portal). In this example, a possible implementation of optical communication is shown using a multimode fiber 160 (optical physical domain) to provide a physical layer channel to a remote optical network terminal (ONT) 164 of the remote display 163 from the digital communication transceiver 153, which includes an optical line terminal (OLT) 159. The remote optical network terminal (ONT) and optical line terminal (OLT) are accepted optical networks terminology. The ONT and OLT notation is used in this application document and in FIG. 18 refers to the optical splitter modules of the communication terminals, which are essential to understanding the novel functionality of the cybersecure optical channel communication.

With the proliferation of edge technology devices, commonly referred to Internet of things (IoT) or Internet of industrial things (IoIT), the vulnerability of the IoT is addressed and new solutions with improved cybersecurity continue to be updated. However, it is a continually evolving problem. Given the utility of the devices based on this application to protect critical infrastructure systems, the cybersecurity of the surge protection devices (SPD) communications is essential. The current application provides a cybersecure solution using an optical communication channel from each SPD to a remote display center (portal, command and control center, etc.). The essence of the implemented secure channel is the utilization of coherent optical signals with different wavelengths to provide two separate channels in a single optical (photonic) domain using appropriately tuned lasers and photodetectors. This method is known as Wavelength Division Multiple Access (WDMA) coexistence and has many applications with different implementations. The WDMA is used differently in this application. Nevertheless, the implementation of the proposed method is compatible with commercially available network devices for deployment of multiple network nodes (SPDs in this case) on critical infrastructure local area networks (LAN). The description of the WDMA associated hardware, software, and protocols are not in the scope of this application. Only related aspects, specific to this application, are described.

Referring to FIG. 18, the three submodules of the digital communication transceiver 153 are displayed: an input/output communication module 157, an electrooptical converter module 158, and an optical line terminal (OLT) 159. The input of the input/output communication module 157 of the digital communication transceiver 153 is the interface 154. An output port of the OLT 159 is the communication output channel 125, which in this example connects directly to the optical fiber cable 160. A communication to the remote location ONT 164 of the remote display 163, uses an optical link with a given wavelength $\lambda_1$ (for example, 1310 nm), illustrated in FIG. 18 with a dotted line 161. The frequency of the communication is defined as to assure real time status report. The absence of communication is an indication for a malfunction, or a physical disconnect.

An implementation of a light source in the electrooptical converter module 158 is used to communicate to the remote display the complete loss of input AC power using a pulse mode optical signal. The optical source is coupled to the optical channel 160 via OLT 159 and transmits intermittently when the DC power is provided by the super capacitor module (DC voltage lower than the nominal DC voltage supply).

The regular communication on the optical channel 160 is only one-way, from the OLT 159 of the digital communication transceiver 153, to the ONT 164 of the remote portal 163. This the default operational mode of "transmit only" using one-way mode of communication to the remote display. It is illustrated using a segment 167 of the optical channel 160 and provides a complete cyber-proof communication for any surge protection device using the described one-directional mode of communication. Each SPD has a unique identification used for network configuration, authentication, and during communication. Multiple identification techniques have been developed and are used for optical network communication and their detail description are beyond the scope of the current application.

The one-directional communication provides security by limiting online access to the connected SPDs during regular operation even when the network security is compromised. However, one-directional communication has obvious constrains and limitation. Practical device installations on any network require two-directional communication which is the standard for multiple reasons: configuration, time synchronization, maintenance, software updates, and others. This application uses a second wavelength $\lambda_2$ (for example, 1490 nm), illustrated in FIG. 18 with a dashed line 162, to enable in a controlled manner a secure two-directional communication on demand, as described further.

The second wavelength $\lambda_2$ is not part of the network communication (which is based on wavelength $\lambda_1$). The second wavelength $\lambda_2$ is combined with $\lambda_1$ into the optical fiber cable 160 at the ONT 164 and respectively separated from $\lambda_1$ at the OLT 159 using optical splitters. At the remote display location, a laser source 165 is used to generate $\lambda_2$ and it is combined with $\lambda_1$ using splitter 164. At the OLT 159, the $\lambda_2$ is separated from $\lambda_1$ using optical splitter 159. The wavelength $\lambda_2$ is used to indicate to the microcontroller subsystem 152 to switch the digital communication transceiver 153 to two-directional communication session (full duplex communication), as illustrated with a segment 168 of the optical channel 160. The injection of waveform $\lambda_2$ at the ONT 164 of the remote location 163 is from a source 165 that is not connected as a communication node on the network. A trusted user at the remote location (an operator with security credentials) initiates a two-way communication to one or multiple SPDs by activating the source 165. In this regard, the proposed security method may be viewed as an independent (separate) authentication for the initiation of two-directional communication. In summary, the switching to two-directional communication happens if, and only if, the $\lambda_2$ is present in the optical channel, being transmitted from the secured source 165, which is not connected as a node on the LAN and is accessed only by an authenticated operator with security credentials. Furthermore, an optical filter 169 is a bandpass for $\lambda_1$ only, preventing the possibility of injecting $\lambda_2$ into the ONT 164.

Figure 19:
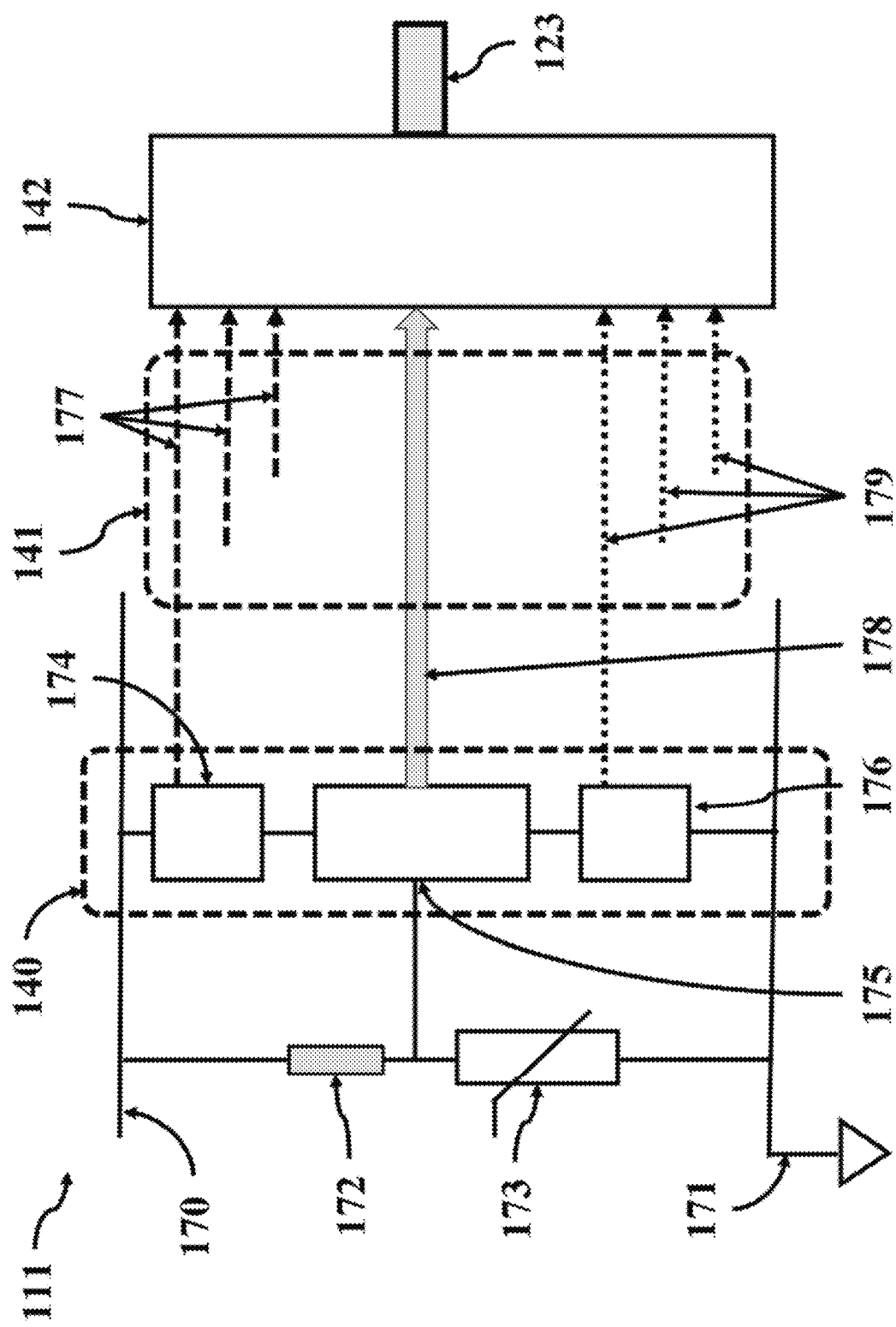
FIG. 19 is a block diagram whit some subcircuit details for analog sensor implementation to monitor the electric power lines, the SPCs, and to provide indication on the local display subsystem; nd

Looking to FIG. 19, a block diagram is presented with some additional subcircuit details for the analog sensors and display (ASD) subsystem 111, previously displayed in FIG. 16. A metal oxide varistor (MOV) 173 is use as an example of a surge protection component, as previously shown in FIG. 12. The MOV is presented with its thermal fuse 172, forming a thermal MOV (TMOV)—a three-terminal component, connected between the AC power lines 170 and 171. During a normal operation, the low impedance of the fuse 172 provides AC power to analog circuits 175 and 176 and is shunting an analog circuit 174. The analog circuits 174, 175, and 176 form a section of analog sensor circuits 140 of the ADS subsystem 111, as shown in FIG. 16. Multiple sections of analog sensor circuits 140 are connected to the visual and sound indicators of the annunciation display module (ADM) 142 via lines 177, 178, and 179, which form the connecting signal bus 141 to drive visual and sound indicators of the annunciation display module (ADM) 142, as displayed in FIG. 16. The high voltage levels of all monitored points are further passed on to the high voltage bus 123.

Looking to FIG. 20, a table with the summary of all possible status conditions and their respective visual and sound alarm indications is presented. The Phase 1, Phase 2, and Phase 3 rows correspond to the three LED indicators in the corners of the triangular group of LEDs 143, shown in FIG. 16, and associated with one of the phases of a three-phase AC power line (Ph1, Ph2, and Ph3). The center LED in the group 143 is an LED indicating the normal status (connected) or loss of connection to the ground line of the AC power supply 104 and loss of ground connection. The AC Power and high temperature status (temperature above a preset level) is indicated with the LED 144 as an overall visual alarm combined with an audible alarm by a sound source 145. During complete loss of AC input power, the alarm visual indicator 144 and the sound indicator 145 are activated intermittently as shown in the columns four and five of the Table in FIG. 20.

Many different arrangements and configurations of the system described and depicted, as well as components and features not shown, are possible without departing from the scope of the claims below. Likewise, variations in the order of the steps of the method described, as well as different combinations of steps, are within the scope of the present invention. Embodiments of the technology have been described with the intent to be illustrative rather than restrictive. Alternative embodiments will become apparent to readers of this disclosure after and because of reading it. Alternative means of implementing the aforementioned can be completed without departing from the scope of the claims below. Identification of structures as being configured to perform a particular function in this disclosure and in the claims below is intended to be inclusive of structures and arrangements or designs thereof that are within the scope of this disclosure and readily identifiable by one of skill in the art and that can perform the particular function in a similar way. Certain features and sub-combinations are of utility and may be employed without reference to other features and sub-combinations and are contemplated within the scope of the claims.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described.

It is understood that while certain forms of this invention have been illustrated and described, it is not limited thereto except insofar as such limitations are included in the following claims and allowable functional equivalents thereof.

What is claimed is:

1. A method for persistent monitoring, detecting, and protecting a monitored infrastructure from a high-altitude electromagnetic pulse (HEMP), mitigating the effects of the HEMP, and communicating in real time the status of the monitored infrastructure locally and remotely so as to protect the monitored infrastructure, said method for monitoring, detecting, and protecting, comprising:

a phase unit receiving sensor signals from a plurality of sensors electrically connected individually to each of a first phase, second phase, and third phase electrical line, respectively, upstream of and associated with the monitored infrastructure, said plurality of sensors generating amplitude and status data in real time and communicating said amplitude and status data via a cybersecure optical communication channel; and determining in real time if said sensor signals associated with said respective electrical line are indicative of an E1 component of the HEMP and, if so, actuating a mitigation response in less than 300 nanoseconds to electrically shunt, redirect, limit, and absorb an excess of surge energy on said respective electrical line to prevent propagation of hazardous electrical signals to the monitored infrastructure and, if not, continuing to monitor said sensor signals;

wherein said determining in real time if said sensor signals associated with said respective electrical line are indicative of electromagnetic fields associated with the E1 component of the HEMP while originating from intentional electromagnetic interference (IEMI) sources and, if so, actuating a mitigation response to prevent propagation of hazardous electrical transient energy to the monitored infrastructure and, if not, continuing to monitor said sensor signals.

2. The method for persistent monitoring, detecting, and mitigating as in claim 1, further comprising:

determining in real time if said sensor signals associated with said respective electrical line is indicative of an E2 and E3 component of the HEMP and, if so, actuating a mitigation response to electrically shunt, redirect, limit, and absorb an excess of surge energy on said respective electrical line to prevent propagation of hazardous electrical signals to the monitored infrastructure and, if not, continuing to monitor said sensor signals; and determining in real time if said sensor signals associated with said respective electrical line are indicative of electromagnetic fields associated with the E3 component of a HEMP while originating from Geomagnetic disturbance (GMD) and, if so, actuating a mitigation to prevent propagation of hazardous electrical transient energy to the monitored infrastructure and, if not, continuing to monitor said sensor signals.

3. The method for persistent monitoring, detecting, and mitigating as in claim 2, wherein said determining in real time if said sensor signals associated with said respective electrical line are indicative of the E1, E2, and E3 components of the HEMP while originating from the IEMI or the GMD, respectively, includes instantaneous evaluation of surge amplitudes versus time values.

4. The method for persistent monitoring, detecting, and mitigating as in claim 2, wherein said determining in real time if said sensor signals associated with said respective electrical line are indicative of the E1, E2, and E3 components of the HEMP while originating from the IEMI or the GMD, respectively, includes instantaneously responding to limit an impact of transient surge energy on the monitored infrastructure so as to form a surge protection system for said electrical lines and said sensors.

5. The method for persistent monitoring, detecting, and mitigating as in claim 1, further comprising using analog circuits for instantaneously capturing and evaluating parameters of said sensor signals associated with impinging surge transient voltages on said electrical lines of the monitored infrastructure such that rated breakdown voltages of analog circuit components exceed a predetermined protection limit level.

6. The method for persistent monitoring, detecting, and mitigating as in claim 4, wherein said instantaneously capturing and evaluating parameters of said sensor signals associated with impinging surge transient voltages on said electrical lines of the monitored infrastructure includes using analog circuits for scaling said sensor signals to low logical levels and using an on-board microcontroller configured for processing said scaled sensor signals with embedded digital signal processing algorithms.

7. The method for persistent monitoring, detecting, and mitigating as in claim 6, wherein said instantaneously capturing and evaluating parameters of said sensor signals associated with impinging surge transient voltages on said electrical lines of the monitored infrastructure includes transmitting said captured and evaluated parameters for display as a local status information to a remote display location associated with the monitored infrastructure using said cybersecure optical communication channel supporting multiple optical wavelengths and directional mode control.

8. The method for persistent monitoring, detecting, and mitigating as in claim 7, wherein said cybersecure optical communication channel is configured to use either a one-way mode of communication and a two-way mode of communication when actuated by said remote display location associated with the monitored infrastructure.

9. The method for persistent monitoring, detecting, and mitigating as in claim 8, further comprising:

configuring said onboard microcontroller to format status messages, including metadata for device identification and time stamping, and to transmit said status messages to said remote display location using said one-way mode of communication;

configuring said onboard microcontroller to switch said optical communications channel between said one-way mode of communication and said two-way mode of communication upon receiving a predetermined optical wavelength signal; and configuring said onboard microcontroller to interface said electrical lines to said remote display location.

10. The method for persistent monitoring, detecting, and mitigating as in claim 8, further comprising indicating a channel malfunction or unauthorized intrusion using said optical communication channel and said local status information.

11. The method for persistent monitoring, detecting, and mitigating as in claim 2, further comprising using a plurality of analog sensing circuits for monitoring, capturing, and reporting predetermined operational values associated with said electrical lines of said monitored infrastructure, respectively, wherein visual and audible indicators are used to indicate normal and fault status conditions regarding each respective electrical line.

12. A method for persistent monitoring, detecting, and protecting a monitored infrastructure from a high-altitude electromagnetic pulse (HEMP), mitigating the effects of the HEMP, and communicating in real time the status of the monitored infrastructure locally and remotely via a cybersecure optical communication channel so as to protect the monitored infrastructure, said method for monitoring, detecting, protecting, and mitigating, comprising:
 a phase unit receiving sensor signals from a plurality of sensors electrically connected individually to each of a first phase, second phase, and third phase electrical line, respectively, upstream of and associated with the monitored infrastructure, said plurality of sensors generating amplitude and status data in real time and communicating said data via a cybersecure optical communication channel; and
 determining in real time if said sensor signals associated with said respective electrical line are indicative of electromagnetic fields associated with an E1 component of the HEMP while also originating from intentional electromagnetic interference (IEMI) sources and, if so, actuating a mitigation response to prevent propagation of hazardous electrical transient energy to the monitored infrastructure and, if not, continuing to monitor said sensor signals.

13. The method for persistent monitoring, detecting, and mitigating as in claim 12, further comprising determining in real time if said sensor signals associated with said respective electrical line are indicative of an E1 component of the HEMP and, if so, actuating a mitigation response in less than 300 nanoseconds to electrically shunt, redirect, limit, and absorb an excess of surge energy on said respective electrical line to prevent propagation of hazardous electrical signals to the monitored infrastructure and, if not, continuing to monitor said sensor signals.

14. The method for persistent monitoring, detecting, and mitigating as in claim 13, further comprising:
 determining in real time if said sensor signals associated with said respective electrical line are indicative of electromagnetic fields associated with the E3 component of a HEMP while originating from Geomagnetic disturbance (GMD) and, if so, actuating a mitigation response to prevent propagation of hazardous electrical transient energy to the monitored infrastructure and, if not, continuing to monitor said sensor signals.

15. The method for persistent monitoring, detecting, and mitigating as in claim 14, further comprising:
 determining in real time if said sensor signals associated with said respective electrical line is indicative of an E2 and E3 component of the HEMP and, if so, actuating a mitigation response to electrically shunt, redirect, limit, and absorb an excess of surge energy on said respective electrical line to prevent propagation of hazardous electrical signals to the monitored infrastructure and, if not, continuing to monitor said sensor signals.

16. The method for persistent monitoring, detecting, and mitigating as in claim 15, wherein said determining in real time if said sensor signals associated with said respective electrical line are indicative of the E1, E2, and E3 components of the HEMP while originating from the IEMI or the GMD, respectively, includes instantaneously evaluating surge amplitudes versus time values associated with said IEMI and said GMD.

17. The method for persistent monitoring, detecting, and mitigating as in claim 15, wherein said determining in real time if said sensor signals associated with said respective electrical line are indicative of the E1, E2, and E3 components of the HEMP while originating from the IEMI or the GMD, respectively, includes instantaneously responding to limit an impact of transient surge energy on the monitored infrastructure so as to form a surge protection system for said electrical lines and said sensors.

18. The method for persistent monitoring, detecting, and mitigating as in claim 12, further comprising instantaneously capturing and evaluating parameters of said sensor signals associated with impinging surge transient voltages on said electrical lines associated with the monitored infrastructure using analog circuits such that rated breakdown voltages of analog circuit components exceed a predetermined protection limit level.

19. The method for persistent monitoring, detecting, and mitigating as in claim 18 further comprising:
 instantaneously monitoring, capturing, and reporting predetermined operational values associated with said electrical lines of said monitored infrastructure, respectively, using another plurality of analog sensing circuits; and
 using visual and audible indicators indicate normal and fault status conditions regarding each respective electrical line.

20. The method for persistent monitoring, detecting, and mitigating as in claim 18, wherein said instantaneously capturing and evaluating parameters of said sensor signals associated with impinging surge transient voltages on said electrical lines of the monitored infrastructure includes transmitting said captured and evaluated parameters to a remote display location associated with the monitored infrastructure for display as a local status information using said cybersecure optical communication channel supporting multiple optical wavelengths signals and directional mode control.

21. The method for persistent monitoring, detecting, and mitigating as in claim 20, wherein said cybersecure optical communication channel is configured to use either a one-way mode of communication using one of the said supported multiple optical wavelength signals and a two-way mode of communication when actuated using a different one of the said multiple optical wavelength signals by said remote display location associated with the monitored infrastructure.

22. The method for persistent monitoring, detecting, and mitigating as in claim 21, wherein said instantaneously capturing and evaluating parameters of said sensor signals associated with impinging surge transient voltages on said electrical lines of the monitored infrastructure includes using analog circuits for scaling said sensor signals to low logical levels and using an on-board microcontroller configured for processing said scaled sensor signals with embedded digital signal processing algorithms.

23. The method for persistent monitoring, detecting, and mitigating as in claim 22, further comprising:
 configuring said onboard microcontroller to format status messages, including metadata for device identification and time stamping, and to transmit said status messages to said remote display location using said one-way mode of communication;
 configuring said onboard microcontroller to switch said optical communications channel between said one-way mode of communication and said two-way mode of communication upon receiving a predetermined optical wavelength signal; and configuring said onboard microcontroller to interface said electrical lines to said remote display location.

24. A method for persistent monitoring, detecting, and protecting a monitored infrastructure from a high-altitude electromagnetic pulse (HEMP), mitigating the effects of the HEMP, and communicating in real time the status of the monitored infrastructure locally and remotely via a cybersecure channel so as to protect the monitored infrastructure, said method for monitoring, detecting, protecting, and communicating, comprising:

a phase unit receiving sensor signals from a plurality of sensors electrically connected individually to each of a first phase, second phase, and third phase electrical line, respectively, upstream of and associated with the monitored infrastructure, said plurality of sensors generating amplitude and status data in real time and communicating said data via a cybersecure optical communication channel; and determining in real time if said sensor signals associated with said respective electrical line are indicative of an E1 component of the HEMP and, if so, actuating a mitigation response in less than 300 nanoseconds to electrically shunt, redirect, limit, and absorb an excess of surge energy on said respective electrical line to prevent propagation of hazardous electrical signals to the monitored infrastructure and, if not, continuing to monitor said sensor signals; and determining in real time if said sensor signals associated with said respective electrical line is indicative of an E2 and E3 component of the HEMP and, if so, actuating a mitigation response to electrically shunt, redirect, limit, and absorb an excess of surge energy on said respective electrical line to prevent propagation of hazardous electrical signals to the monitored infrastructure and, if not, continuing to monitor said sensor signals;

determining in real time if said sensor signals associated with said respective electrical line are (1) indicative of electromagnetic fields associated with the E1 component of a HEMP while originating from intentional electromagnetic interference (IEMI) sources or are (2) indicative of electromagnetic fields associated with the E3 component of a HEMP while originating from Geomagnetic disturbance (GMD) and, if so, actuating a mitigation response to prevent propagation of hazardous electrical transient energy to the monitored infrastructure and, if not, continuing to monitor said sensor signals.

25. The method for persistent monitoring, detecting, and mitigating as in claim 24, wherein said determining in real time if said sensor signals associated with said respective electrical line is indicative of the E1, E2, and E3 component of the HEMP, surge transients induced by IEMI or surge transients induced by GMD includes instantaneously evaluating said surge amplitudes versus time values.

26. The method for persistent monitoring, detecting, and mitigating as in claim 24, further comprising using analog circuits for instantaneously capturing and evaluating parameters of said sensor signals associated with impinging surge transient voltages on said electrical lines of the monitored infrastructure such that rated breakdown voltages of analog circuits components exceed a predetermined protection limit level.

27. The method for persistent monitoring, detecting, and mitigating as in claim 24, wherein said determining in real time if said sensor signals associated with said respective electrical line are indicative of the E1, E2, and E3 component of the HEMP while originating from an IEMI or an GMD, respectively, includes instantaneously responding to limit an impact of transient surge energy on the monitored infrastructure so as to form a surge protection system for said electrical lines and said plurality of sensors.

28. The method for persistent monitoring, detecting, and mitigating as in claim 26, wherein said instantaneously captured and evaluated parameters of impinging surge transient voltages on said electrical lines are transmitted to a remote display location using said cybersecure optical communication channel and displayed as a local status information using visual and audible indicators.

29. The method for persistent monitoring, detecting, and mitigating as in claim 28, wherein:

said cybersecure optical communication channel uses multiple optical wavelength signals and directional mode control;

one of said optical wavelength signals is configured to transmit said local status information to said remote display location using one-way communication mode.

30. The method for persistent monitoring, detecting, and mitigating as in claim 29, wherein:

said cybersecure optical communication channel is configured for two-way mode of communication by said remote display location associated with the monitored infrastructure using a secondary optical wavelength signal of the said multiple optical wavelength signals; and said secondary optical wavelength signal used for configuring said cybersecure optical channel for the two-way mode of communication by said remote display location associated with the monitored infrastructure is controlled by the remote display location by blocked and not supported outside the said optical communication channel.

* * * * *